United States Patent
Takeda

(10) Patent No.: US 7,961,042 B2
(45) Date of Patent: Jun. 14, 2011

(54) AMPLIFIER CIRCUIT AND MAGNETIC SENSOR

(75) Inventor: Toru Takeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/721,755

(22) Filed: Mar. 11, 2010

(65) Prior Publication Data

US 2010/0237936 A1    Sep. 23, 2010

(30) Foreign Application Priority Data

Mar. 19, 2009    (JP) ................... 2009-068824

(51) Int. Cl.
*H03F 1/02*    (2006.01)

(52) U.S. Cl. .............................. 330/9; 330/69

(58) Field of Classification Search ............... 330/9, 51, 330/310, 150, 98, 69
See application file for complete search history.

(56) References Cited

U.S. PATENT DOCUMENTS

| | | | |
|---|---|---|---|
| 4,896,156 A * | 1/1990 | Garverick | 341/143 |
| 5,621,319 A | 4/1997 | Bilotti et al. | |
| 6,333,673 B2 * | 12/2001 | Dawes | 330/9 |
| 6,400,295 B1 * | 6/2002 | Van Herzeele | 341/143 |
| 6,794,863 B2 | 9/2004 | Hatanaka | |
| 7,852,254 B1 * | 12/2010 | Ginetti | 341/172 |
| 2008/0197834 A1 | 8/2008 | Takeda | |

FOREIGN PATENT DOCUMENTS

| | | |
|---|---|---|
| JP | 2006-174122 | 6/2006 |
| JP | 2008-236737 | 10/2008 |

* cited by examiner

*Primary Examiner* — Henry K Choe
(74) *Attorney, Agent, or Firm* — Turocy & Watson, LLP

(57) ABSTRACT

An amplifier circuit, includes: a first amplifier; a second amplifier; a first capacitor connected to the first amplifier; a second capacitor having one terminal connected to the first amplifier, another terminal connected to the second input terminal; and a first switch circuit switching a connection of the output terminal, the another terminal of the first capacitor, the first input terminal and the second input terminal, and switching supplying a reference potential supply, the first switch circuit including: a first state connecting the first input terminal to the second input terminal, connecting the output terminal to the another terminal of the first capacitor, and supplying the second input terminal with the reference potential, a second state connecting the first input terminal to the another terminal of the first capacitor and providing the output terminal and the second input terminal in an open state.

20 Claims, 11 Drawing Sheets

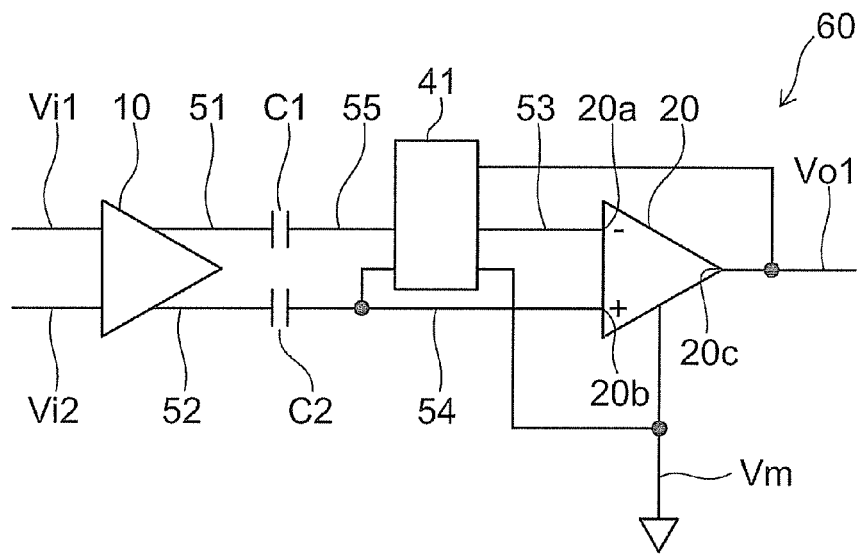
FIG. 1
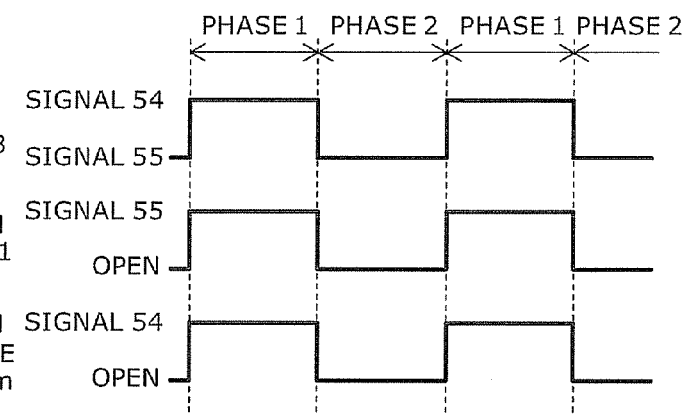
FIG. 2A SOURCE OF SIGNAL 53
FIG. 2B DESTINATION OF SIGNAL Vo1
FIG. 2C DESTINATION OF REFERENCE POTENTIAL Vm

| PHASE | STATE OF SWITCHES SW1 TO SW4 | | | |
|---|---|---|---|---|
| | SW1 | SW2 | SW3 | SW4 |
| PHASE 1 | ON | OFF | ON | ON |
| PHASE 2 | OFF | ON | OFF | OFF |

FIG. 8A SWITCH SW1

FIG. 8B SWITCH SW2

FIG. 8C SWITCH SW3

FIG. 8D SWITCH SW4

| PHASE | STATE OF SWITCHES SW1 TO SW5 | | | | |
|---|---|---|---|---|---|
| | SW1 | SW2 | SW3 | SW4 | SW5 |
| PHASE 1 | ON | OFF | ON | ON | OFF |
| PHASE 2 | OFF | ON | OFF | OFF | OFF |
| PHASE 2' | OFF | ON | OFF | OFF | ON |

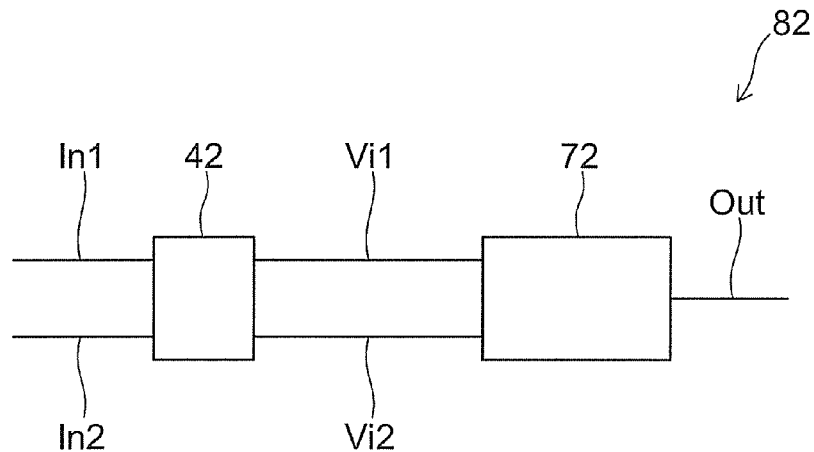
FIG. 14
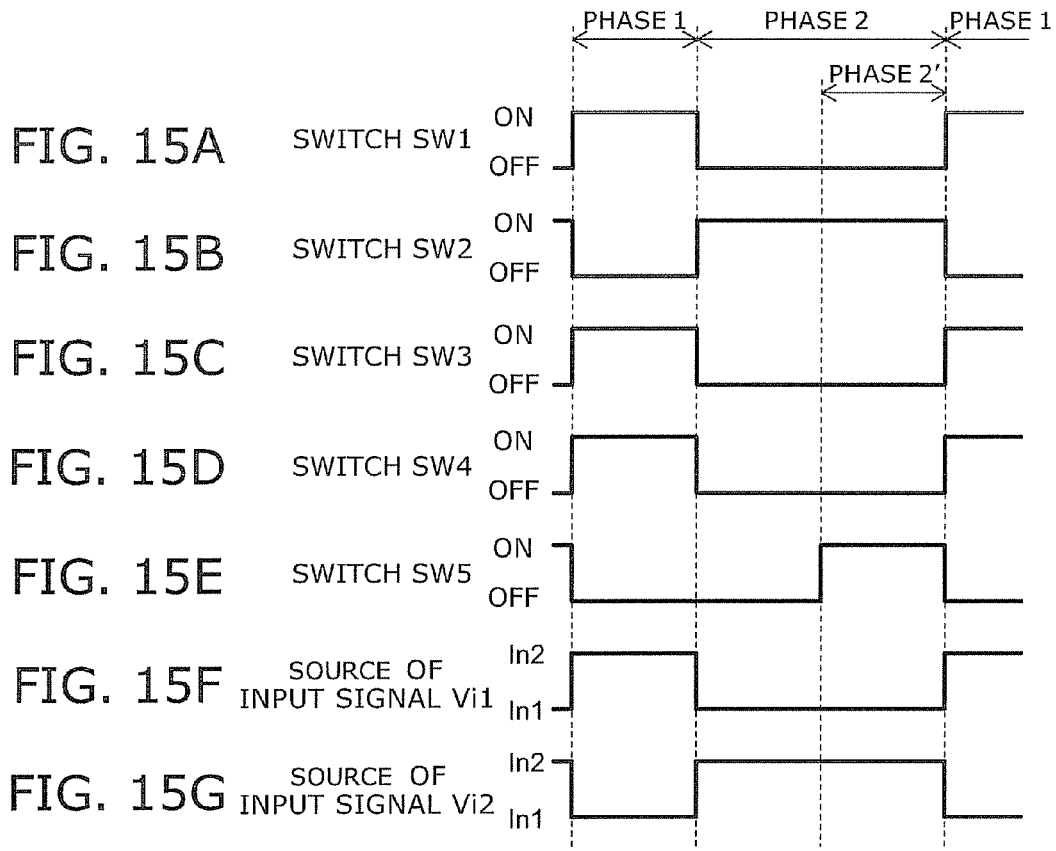
FIG. 15A SWITCH SW1
FIG. 15B SWITCH SW2
FIG. 15C SWITCH SW3
FIG. 15D SWITCH SW4
FIG. 15E SWITCH SW5
FIG. 15F SOURCE OF INPUT SIGNAL Vi1
FIG. 15G SOURCE OF INPUT SIGNAL Vi2

AMPLIFIER CIRCUIT AND MAGNETIC SENSOR

CROSS-REFERENCE TO RELATED APPLICATIONS

This application is based upon and claims the benefit of priority from the prior Japanese Patent Application No. 2009-068824, filed on Mar. 19, 2009; the entire contents of which are incorporated herein by reference.

BACKGROUND OF THE INVENTION

1. Field of the Invention

The invention relates to an amplifier circuit and a magnetic sensor having reduced offset voltages.

2. Background Art

Instrumentation amplifiers are used to amplify weak output voltages of magnetic sensors, acceleration sensors, and the like.

High-precision and high gain are necessary for instrumentation amplifiers to amplify weak voltages; and direct current amplification by operational amplifiers is performed.

However, when offset voltages due to mismatch or temperature-related drift occur in the operational amplifier itself, the signal components of the amplified input signal cannot be discriminated, and high-precision amplification is impossible. Therefore, characteristics such as low drift and low offset are necessary for high-precision amplification; and there have been proposals including offset voltage adjustment circuits (for example, refer to JP-A 2006-174122 (Kokai)).

Also, signal detection circuits have been proposed to amplify the weak voltage of a Hall element and the like, set any detection threshold voltage, reduce the effects of the offset signal components included in the output, and perform a high-precision binary detection (for example, refer to JP-A 2008-236737 (Kokai)).

SUMMARY OF THE INVENTION

According to an aspect of the invention, there is provided an amplifier circuit, including: first amplifier amplifying a first and a second input signal, and outputting a first and a second signal; a second amplifier amplifying a difference between a third signal of a first input terminal and a fourth signal of a second input terminal, and outputting a first output signal from an output terminal; a first capacitor, having one terminal connected to the first amplifier, receiving the first signal; a second capacitor, having one terminal connected to the first amplifier, and another terminal connected to the second input terminal, receiving the second signal and outputting the fourth signal; and a first switch circuit, switching a connection of the output terminal, another terminal of the first capacitor, the first input terminal, and the second input terminal, and switching to supply the second input terminal and the another terminal of the first capacitor with a reference potential, the first switch circuit configured to be a first state, wherein the first switch circuit connects the first input terminal to the second input terminal, and the output terminal to the another terminal of the first capacitor to supply a potential of the another terminal of the first capacitor with a potential of the first output signal output by the second amplifier set to a gain of unity, supplies the second input terminal and the another terminal of the second capacitor with the reference potential, and the first capacitor and the second capacitor are charged, and a second state, wherein the first switch circuit connects the first input terminal to the another terminal of the first capacitor, provides the output terminal and the second input terminal in an open state, and the second amplifier amplifies a difference between a signal of the another terminal of the first capacitor and a signal of the another terminal of the second capacitor to output the first output signal.

According to another aspect of the invention, there is provided an amplifier circuit, including: a first amplifier amplifying a first and a second input signal, and outputting a first and a second signal; a second amplifier amplifying a difference between a third signal of a first input terminal and a fourth signal of a second input terminal and outputting a first output signal from an output terminal; a first capacitor, having one terminal connected to the first amplifier, receiving the first signal; a fifth switch connecting another terminal of the first capacitor to the output terminal or the first input terminal of the second amplifier; and a sixth switch switching to supply the first input terminal of the second amplifier with a reference potential, the fifth switch and the sixth switch configured to be a first state, wherein the fifth switch connects the another terminal of the first capacitor to the output terminal of the second amplifier to supply a potential of the another terminal of the first capacitor with a potential of the first output signal of the second amplifier set to a gain of unity, and the sixth switch supplies the first input terminal of the second amplifier with the reference potential, the second amplifier amplifies a difference between the reference potential and the second signal output by the first amplifier, and the first capacitor is charged; and a second state, wherein the fifth switch connects the another terminal of the first capacitor to the first input terminal of the second amplifier, the sixth switch turns OFF not to supply the first input terminal of the second amplifier with the reference potential, and the second amplifier to amplify a difference between a signal of the another terminal of the first capacitor and the second signal output by the first amplifier to output the first output signal.

According to still another aspect of the invention, there is provided a magnetic sensor, including: an amplifier circuit, the circuit including: a first amplifier amplifying a first and a second input signal, and outputting a first and a second signal; a second amplifier amplifying a difference between a third signal input into a first input terminal and a fourth signal input into a second input terminal and outputting a first output signal from an output terminal; a first capacitor, having one terminal connected to the first amplifier, receiving the first signal; a second capacitor, having one terminal connected to the first amplifier, and another terminal connected to the second input terminal, receiving the second signal and outputting the fourth signal; and a first switch circuit, switching a connection of the output terminal, another terminal of the first capacitor, the first input terminal, and the second input terminal, and switching to supply the second input terminal and the another terminal of the first capacitor with a reference potential; a Hall element comprising a first terminal pair and a second terminal pair positioned on mutually orthogonal lines; and a third switch circuit supplying a supply potential and a ground potential to the first terminal pair or the second terminal pair and providing outputs of the second terminal pair or the first terminal pair as the first input signal and the second input signal, the first switch circuit configured to be a first state, wherein the first switch circuit connects the first input terminal to the second input terminal, and the output terminal to the another terminal of the first capacitor to supply a potential of the another terminal of the first capacitor with a potential of the first output signal output by the second amplifier set to a gain of unity, supplies the second input terminal and the another terminal of the second capacitor with the reference potential, and the first capacitor and the second capacitor are charged, and a second state, wherein the first switch circuit connects the first input terminal to the another terminal of the first capacitor, provides the output terminal and the second input terminal in an open state, and the second amplifier amplifies a difference between a signal of the another terminal of the first capacitor and a signal of the another terminal of the second capacitor to output the first output signal, the third switch circuit configured to be the first state, wherein the third switch circuit supplies the supply potential and the ground potential to the first terminal pair and provides outputs of the second terminal pair as the first input signal and the second input signal, and the second state, wherein the third switch circuit supplies the supply potential and the ground potential to the second terminal pair and provides outputs of the first terminal pair as the first input signal and the second input signal.

BRIEF DESCRIPTION OF THE DRAWINGS

FIG. 1 is a block diagram illustrating the configuration of an amplifier circuit according to an embodiment of the invention;

FIGS. 2A to 2C are timing charts illustrating the connection states of a first switch circuit showed in FIG. 1;

FIGS. 8A to 8D are timing charts illustrating the connection states of each of the switches of the amplifier circuit showed in FIG. 6;

FIG. 14 is a block diagram illustrating the configuration of an amplifier circuit according to another embodiment of the invention;

FIGS. 15A to 15G are timing charts illustrating the connection states and the main signals of each of the switches of the amplifier circuit showed in FIG. 14;

DETAILED DESCRIPTION OF THE INVENTION

Figure 3:
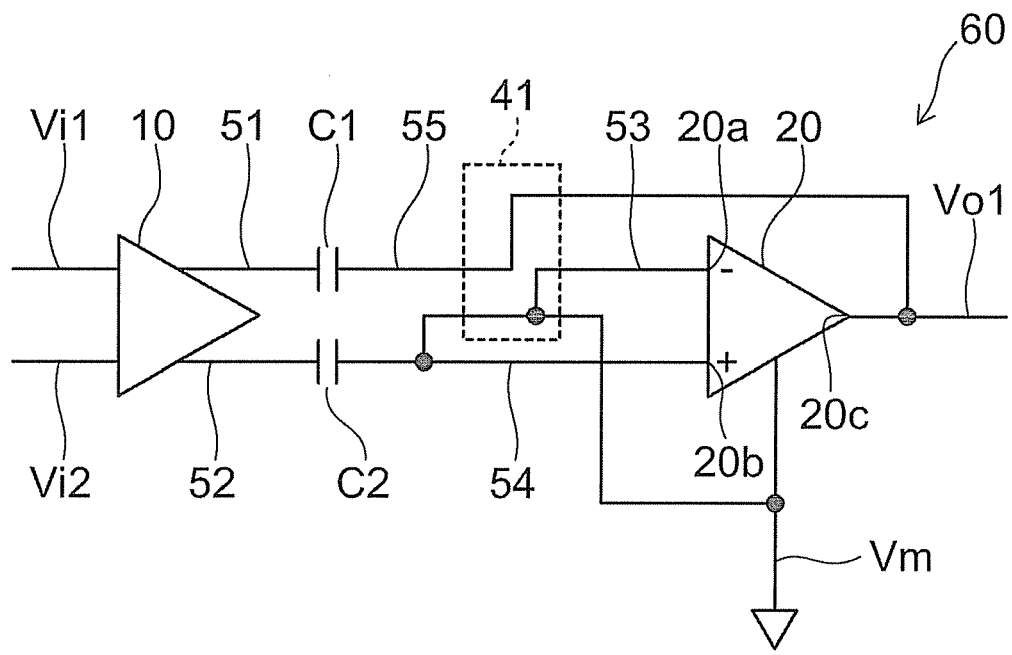
FIG. 3 is a block diagram of the amplifier circuit showed in FIG. 1 in a phase 1 state.

Embodiments of the invention will now be described in detail with reference to the drawings.

In the specification of the application and the drawings, components similar to those described in regard to a drawing thereinabove are marked with like reference numerals, and a detailed description is omitted as appropriate. Like reference numerals are used for signal lines illustrated in the drawings and signals of the signal lines. For example, "signal of the signal line 55" may be abbreviated as "signal 55."

First Embodiment

FIG. 1 is a block diagram illustrating the configuration of an amplifier circuit according to an embodiment of the invention.

As illustrated in FIG. 1, an amplifier circuit 60 of this embodiment includes a first amplifier 10, a second amplifier 20, a first capacitor C1, a second capacitor C2, and a first switch circuit 41.

The first amplifier 10 amplifies a first input signal Vi1 and a second input signal Vi2 to output a first signal 51 and a second signal 52, respectively.

The second amplifier 20 amplifies a difference between a third signal 53 input into a first input terminal 20a (inverted input) and a fourth signal 54 input into a second input terminal 20b (non-inverted input) to output a first output signal Vo1 from an output terminal 20c. The second amplifier 20 differentially amplifies with respect to a reference potential Vm. In other words, the first output signal Vo1, i.e., the output of the second amplifier 20, is the sum of the output of the differential amplification and the reference potential Vm with respect to ground.

One terminal of the first capacitor C1 is connected to the first amplifier 10 and receives the first signal 51.

One terminal of the second capacitor C2 is connected to the first amplifier 10 and receives the second signal 52. The other terminal of the second capacitor C2 is connected to the second input terminal 20b (the non-inverting input terminal) of the second amplifier 20 and outputs the fourth signal 54.

As described below, the first and second amplifiers 10 and 20 reduce the offset voltages by the first and second capacitors C1 and C2.

The first switch circuit 41 connects the other terminal (the signal 55) of the first capacitor C1, the output terminal 20c, the first input terminal 20a, the second input terminal 20b, and the reference potential Vm in prescribed states. For example, switches such as FETs are included. Here, the prescribed states are mutually different states of a phase 1 state (first state) and a phase 2 state (second state).

Here, the phase 1 state (the first state) is a state in which the first input terminal 20a and the second input terminal 20b of the second amplifier 20 are connected; the output terminal 20c and the other terminal (the signal 55) of the first capacitor C1 are connected; and the second input terminal 20b is supplied with the reference potential Vm (FIGS. 2A to 2C). In the first state, the potential of the other terminal 54 of the second capacitor C2 is the reference potential Vm; the potential of the other terminal 55 of the first capacitor C1 is the potential of the signal output by the second amplifier 20, where the second amplifier 20 is set to a gain of unity and has shorted inputs;

and the first capacitor C1 and the second capacitor C2 are charged by the first amplifier 10.

In the phase 2 state (the second state), the first input terminal 20a and the other terminal (the signal 55) of the first capacitor C1 are connected; and the output terminal 20c and the second input terminal 20b are in an open state (FIGS. 2A to 2C).

In the second state, the second amplifier 20 amplifies the difference between the signal of the other terminal 55 of the first capacitor C1 and the signal of the other terminal 54 of the second capacitor C2 to output the first output signal Vo1. In the phase 2 state (the second state), any gain of the second amplifier 20 may be set. As recited above, the second amplifier 20 differentially amplifies with respect to the reference potential Vm.

The control of the states of the first switch circuit 41 may be performed externally. However, the control also may be performed by providing an internal control circuit and periodically switching the states.

Thus, the amplifier circuit 60 of this embodiment includes the first switch circuit 41 having two states (phase 1 and phase 2), where the phase 1 state (the first state) and the phase 2 state (the second state) are different.

In the phase 1 state (the first state), the amplifier circuit 60 has the configuration illustrated in the block diagram of FIG. 3.

In FIG. 3, the first switch circuit 41 is enclosed by the broken line, and the phase 1 state (the electrical connections) of the first switch circuit 41 is illustrated by solid lines.

In the phase 1 state as illustrated in FIG. 3, the output terminal 20c and the other terminal (the signal 55) of the first capacitor C1 are connected. Also, the first input terminal 20a and the second input terminal 20b are connected; and the second input terminal 20b is supplied with the reference potential Vm.

Accordingly, both the potential of the third signal 53 and the potential of the fourth signal 54 are the reference potential Vm. Therefore, if the offset voltages occurring due to mismatch and the like among the elements of the second amplifier 20 are ignored, the potential of the first output signal Vo1 of the second amplifier 20 is equal to the reference potential Vm. Accordingly, the potentials of both the other terminal (the signal 55) of the first capacitor C1 and the other terminal (the signal 54) of the second capacitor C2 are the reference potential Vm.

Figure 4:
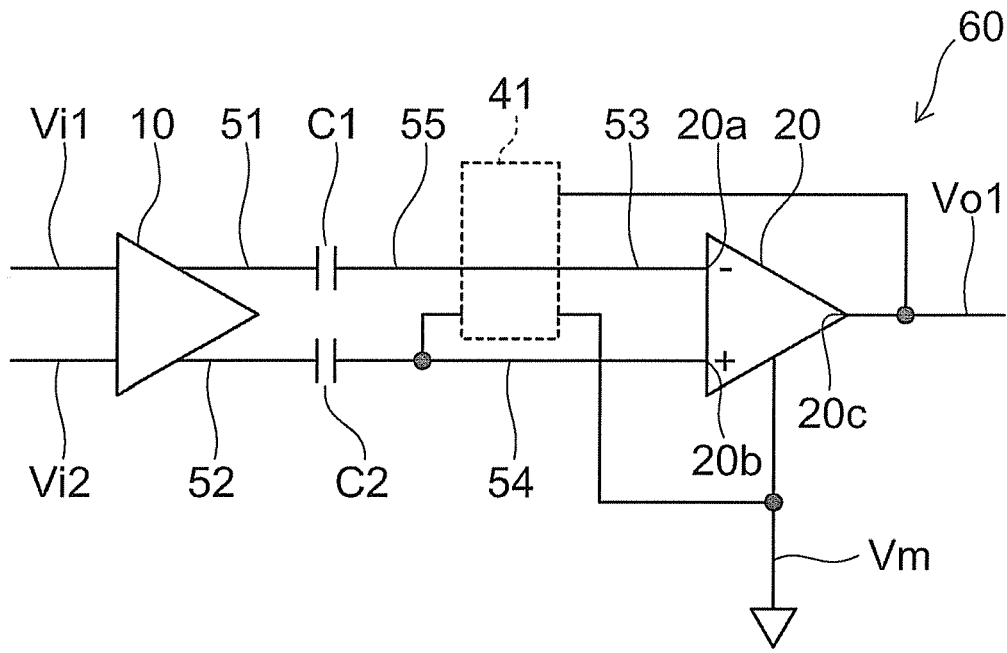
FIG. 4 is a block diagram of the amplifier circuit showed in FIG. 1 in a phase 2 state.

In the phase 2 state (the second state), the amplifier circuit 60 has the configuration illustrated in the block diagram of FIG. 4.

In FIG. 4 as well, the first switch circuit 41 is enclosed by the broken line, and the phase 2 state (the electrical connections) of the first switch circuit 41 are illustrated by solid lines.

In the phase 2 state as illustrated in FIG. 4, the first input terminal 20a of the second amplifier 20 and the other terminal (the signal 55) of the first capacitor C1 are connected. The output terminal 20c and the second input terminal 20b are in an open state.

Accordingly, in the phase 2 state, the second amplifier 20 amplifies the difference between the potentials of the other terminal (the signal 55/the third signal 53) of the first capacitor C1 and the other terminal (the fourth signal 54) of the second capacitor C2 to output the first output signal Vo1.

Although phase 1 and phase 2 are two states of the first switch circuit 41, the states of phase 1 and phase 2 are referred to hereinbelow for the amplifier circuit 60 as well. In other words, the amplifier circuit 60 is in the phase 1 state (the first state) and the phase 2 state (the second state) when the first switch circuit 41 is in the states of phase 1 and phase 2, respectively.

Returning now to FIG. 3, the operations of the amplifier circuit 60 of this embodiment will be described.

In FIG. 3, the first switch circuit 41 of the amplifier circuit 60 is in the phase 1 state.

In this state, the case is considered where a signal having a potential $V_2$ is input as the first input signal Vi1 and a signal having a potential $V_1$ is input as the second input signal Vi2.

The voltages of the signals are the sums of the signal components of the amplified input signals Vi1 and Vi2 and the offset voltages due to mismatch of the elements of the first and second amplifiers 10 and 20 and the like, which do not depend on the input signals Vi1 and Vi2. Here, linearity is assumed; the signal components when the offset voltages are zero are determined separately from the offset voltages when the signal components are zero; and the results are subsequently synthesized.

First, the signal components are considered ignoring the offset voltages.

The signal of the potential $V_2$ is amplified by the first amplifier 10. The one terminal of the first capacitor C1, i.e., a potential $V_{51}$ of the first signal 51, is expressed by Formula (1-1).

$$V_{51}=V_2\times A_v \qquad (1\text{-}1)$$

Here, $A_v$ is the gain of the first amplifier 10.

Similarly, the one terminal of the second capacitor C2, i.e., a potential $V_{52}$ of the second signal 52, is expressed by Formula (1-2).

$$V_{52}=V_1\times A_v \qquad (1\text{-}2)$$

Also, as recited above, the potential of the first output signal Vo1, i.e., the output of the second amplifier 20, is equal to the potential Vm of the fourth signal 54; and both potentials $V_{55}$ and $V_{54}$ of the other terminal (the signal 55) of the first capacitor C1 and the other terminal (the fourth signal 54) of the second capacitor C2, respectively, are Vm.

$$V_{55}=V_{54}=Vm \qquad (1\text{-}3)$$

Accordingly, from Formulas (1-1) to (1-3), voltages $V_{SC1}$ and $V_{SC2}$ of the signal components charged into the first and second capacitors C1 and C2 obey Formulas (1-4) and (1-5), respectively, with the first amplifier 10 side as a reference.

$$V_{SC1}=Vm-V_{51}=Vm-V_2\times A_v \qquad (1\text{-}4)$$

$$V_{SC2}=Vm-V_{52}=Vm-V_1\times A_v \qquad (1\text{-}5)$$

Next, the offset voltages are considered ignoring the signal components (where $V_1=V_2=0$).

The input offset voltages of the first and second input signal sides of the first amplifier 10 are taken to be $V_{offs1}$ and $V_{offs2}$, respectively. Similarly, the input offset voltage of the second amplifier 20 is taken to be $V_{offs3}$. In the phase 1 state, the gain of the second amplifier 20 is unity.

An offset voltage $V_{oc1}$ charged to the first capacitor C1 is expressed by Formula (1-6) with the first amplifier 10 side, i.e., the first signal 51 side, as a reference.

$$V_{oc1}=-V_{offs1}\times A_v+V_{offs3} \qquad (1\text{-}6)$$

An offset voltage $V_{oc2}$ charged to the second capacitor C2 is expressed by Formula (1-7) with the first amplifier 10 side, i.e., the second signal 52 side, as a reference.

$$V_{oc2}=-V_{offs2}\times A_v \qquad (1\text{-}7)$$

Next, as illustrated in FIG. 4, the phase 2 state is considered.

In FIG. 4, the first switch circuit 41 of the amplifier circuit 60 is in the phase 2 state.

In this state, the signal having the potential $V_1$ is input as the first input signal Vi1; and the signal having the potential $V_2$ is input as the second input signal Vi2.

First, the signal components are considered ignoring the offset voltages.

The signal having the potential $V_1$ is amplified by the first amplifier 10. The one terminal of the first capacitor C1, i.e., the potential $V_{51}$ of the first signal 51, is expressed by Formula (1-8).

$$V_{51} = V_1 \times A_v \tag{1-8}$$

Similarly, the one terminal of the second capacitor C2, i.e., the potential $V_{52}$ of the second signal 52, is expressed by Formula (1-9).

$$V_{52} = V_2 \times A_v \tag{1-9}$$

Accordingly, from Formulas (1-4) and (1-8), a potential $V_{53}$ of the third signal 53 is expressed by Formula (1-10).

$$\begin{aligned} V_{53} &= V_{51} + V_{SC1} \\ &= (V_1 - V_2)A_v + Vm \end{aligned} \tag{1-10}$$

Similarly, from Formulas (1-5) and (1-9), the potential $V_{54}$ of the fourth signal 54 is expressed by Formula (1-11).

$$\begin{aligned} V_{54} &= V_{52} + V_{SC2} \\ &= (V_2 - V_1)A_v + Vm \end{aligned} \tag{1-11}$$

From Formulas (1-10) and (1-11), the first output signal Vo1, i.e., the output of the second amplifier 20, is expressed by Formula (1-12) for the signal components.

$$\begin{aligned} Vo1 &= V_{54} - V_{53} \\ &= 2(V_2 - V_1)A_v \end{aligned} \tag{1-12}$$

Next, the offset components are considered.

From Formula (1-6), an offset voltage $V_{o53}$ of the third signal 53 is expressed by Formula (1-13).

$$\begin{aligned} V_{o53} &= V_{ofs1} \times A_v + V_{oc1} \\ &= V_{ofs1} \times A_v + (-V_{ofs1} \times A_v + V_{ofs3}) \\ &= V_{ofs3} \end{aligned} \tag{1-13}$$

Similarly, from Formula (1-7), an offset voltage $V_{o54}$ of the fourth signal 54 is expressed by Formula (1-14).

$$\begin{aligned} V_{o54} &= V_{ofs2} \times A_v + V_{oc2} \\ &= V_{ofs2} \times A_v + (-V_{ofs2} \times A_v) \\ &= 0 \end{aligned} \tag{1-14}$$

Accordingly, from Formulas (1-13) and (1-14), an input offset voltage Vo2 of the second amplifier 20 is expressed by Formula (1-15).

$$\begin{aligned} Vo2 &= V_{o54} - V_{o53} + V_{ofs3} \\ &= 0 \end{aligned} \tag{1-15}$$

Thus, the input offset voltage Vo2 of the second amplifier 20 is zero. Therefore, the offset voltage of the first output signal Vo1 of the second amplifier 20 is zero.

Thus, the offset voltage components of the first output signal Vo1 of the second amplifier 20 are canceled to become zero; and only the output signal with respect to the signal component Vo1=2 $(V_2-V_1) A_v$ remains.

Accordingly, in the amplifier circuit 60 of this embodiment, the first and second input signals Vi1 and Vi2 may be taken to be the inverted signals of the signals measured in the phase 1 state; and the output of the amplified signal components having canceled offset voltage components in the phase 2 state may be taken to be the signal measured in the phase 2 state.

In the case where the phase 1 state and the phase 2 state are periodically repeated, the signal components can be obtained by sampling the first output signal Vo1 when the phase 2 state ends, that is, when switching from the phase 2 state to the phase 1 state.

The gain of the second amplifier 20 in the phase 1 state is unity. However, it is unnecessary for the gain of the second amplifier 20 to be unity in the phase 2 state; and the offset voltage components similarly cancel for values other than one. In other words, as illustrated in Formula (1-15), the input offset voltages of the second amplifier 20 cancel. Therefore, in the phase 2 state, the gain of the second amplifier 20 may be set to any value, and there is no limitation on the gain.

Thus, by using the amplifier circuit 60 of this embodiment, the effects of the offset voltages of the first and second amplifiers 10 and 20 can be reduced. Also, a high-precision amplifier circuit is possible in which the gain may be set in a wide range from low gains to high gains.

Comparative Example

Figure 5:
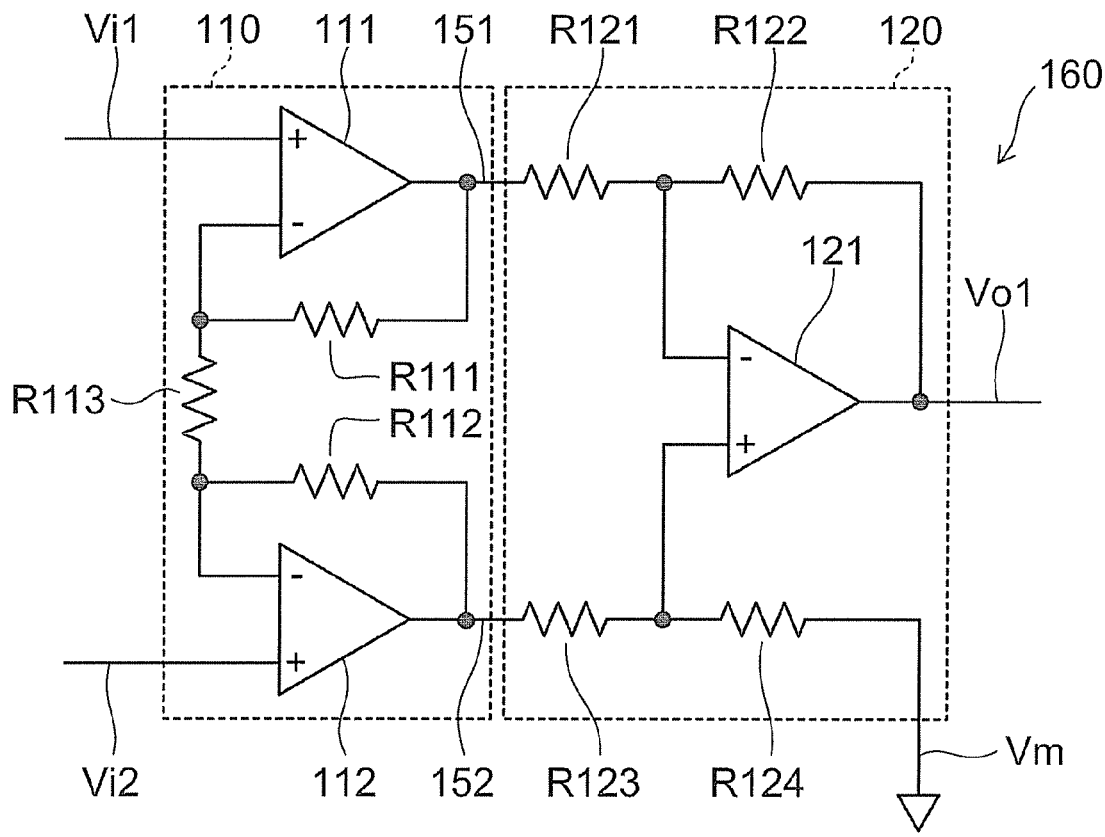
FIG. 5 is a circuit diagram of an amplifier circuit of a comparative example.

FIG. 5 is a circuit diagram of an amplifier circuit of a comparative example.

As illustrated in FIG. 5, an amplifier circuit 160 of the comparative example is a known instrumentation amplifier including an initial-stage amplifier 110 and a post-stage amplifier 120.

The initial-stage amplifier 110 has a configuration in which a resistor R113 connects the inverting input terminal of an operational amplifier 111 including a feedback resistor R111 to the inverting input terminal of an operational amplifier 112 including a feedback resistor R112. The first input signal Vi1 is input into the non-inverting input terminal of the operational amplifier 111. The second input signal Vi2 is input into the non-inverting input terminal of the operational amplifier 112.

The post-stage amplifier 120 includes an operational amplifier 121 having a feedback resistor R122. The output of the operational amplifier 111 is input into the inverting input terminal of the operational amplifier 121 via a resistor R121. Also, the output of the operational amplifier 112 is divided into resistors R123 and R124 connected in series and is input into the non-inverting input terminal. One terminal of the resistor R124 is supplied with the reference potential Vm. The output of the operational amplifier 121 is output as the first output signal Vo1.

The input offset voltages of the initial-stage amplifier 110 and the post-stage amplifier 120 are taken to be $V_{ofs1}$ and $V_{ofs2}$, respectively. The gains thereof are taken to be $A_{v1}$ and $A_{v2}$, respectively. The offset voltage of the instrumentation amplifier 160 is $(V_{ofs1} \times A_{v1} + V_{ofs2}) \times A_{v2}$ and is the error of the instrumentation amplifier 160.

Although an operational amplifier having a CMOS input may be used to increase the input impedance of the amplifier, the input offset voltage of an operational amplifier having a CMOS input is high and causes problems in an instrumentation amplifier.

Conversely, in the amplifier circuit 60 of this embodiment, the offset voltages of the first amplifier 10 and the second amplifier 20 are canceled, and a high-precision amplifier circuit can be provided in which the gain may be in a wide range from low gains to high gains. In particular, in the case where an operational amplifier having a CMOS input with a high input offset voltage but a high input impedance is used, a high-precision amplifier circuit is possible having high input impedance and low offset.

Figure 6:
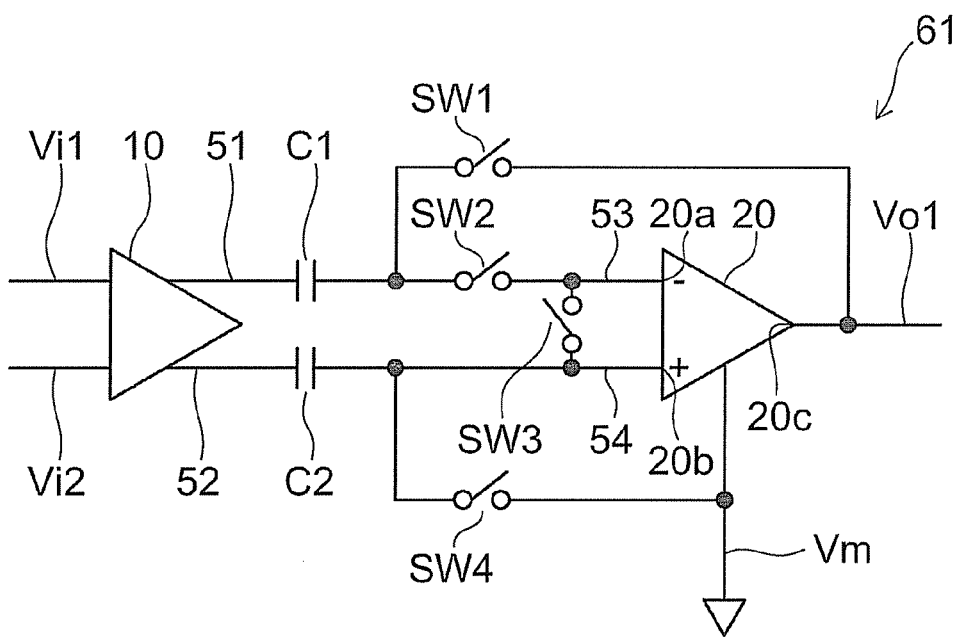
FIG. 6 is a block diagram illustrating another configuration of the amplifier circuit according to the embodiment of the invention.

FIG. 6 is a block diagram illustrating another configuration of the amplifier circuit according to an embodiment of the invention.

As illustrated in FIG. 6, an amplifier circuit 61 of this embodiment includes the first amplifier 10, the second amplifier 20, the first capacitor C1, the second capacitor C2, a first switch SW1, a second switch SW2, a third switch SW3, and a fourth switch SW4.

In other words, in the amplifier circuit 61, the first switch circuit 41 illustrated in FIG. 1 is formed of the first to fourth switches SW1 to SW4.

The first switch SW1 is connected between the other terminal of the first capacitor C1 and the output terminal 20c of the second amplifier 20. The second switch SW2 is connected between the other terminal of the first capacitor C1 and the first input terminal 20a of the second amplifier 20. The third switch SW3 is connected between the first input terminal 20a and the second input terminal 20b. The other terminal of the second capacitor C2 is supplied with the reference potential Vm through the fourth switch SW4. Otherwise, the amplifier circuit 61 is similar to the amplifier circuit 60, and a description is omitted.

By switching each of the first to fourth switches SW1 to SW4 ON and OFF, functions equivalent to those of the first switch circuit 41 are realized.

Figure 7:
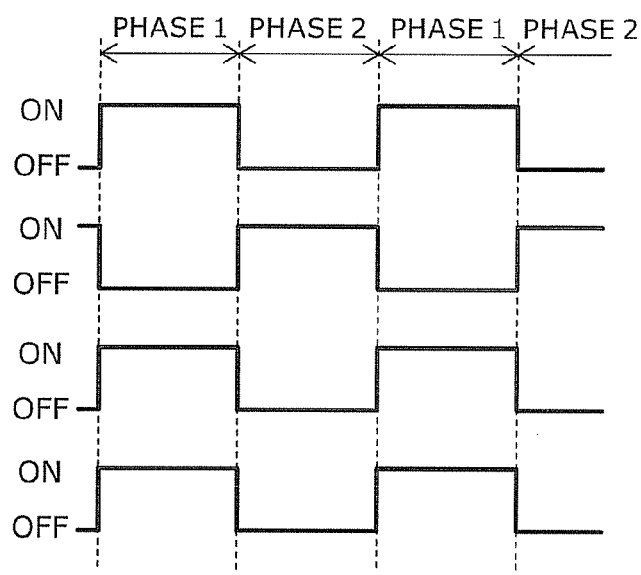
FIG. 7 is a schematic view illustrating the connection states of each of the switches of the amplifier circuit showed in FIG. 6.

FIG. 7 is a schematic view illustrating the connection states of each of the switches of the amplifier circuit 61.

FIGS. 8A to 8D are timing charts illustrating the connection states of each of the switches of the amplifier circuit 61.

As illustrated in FIG. 7 to FIG. 8D, each of the switches SW1 to SW4 has the phase 1 state (the first state) and the phase 2 state (the second state).

In the phase 1 state, the first switch SW1, the third switch SW3, and the fourth switch SW4 are ON; and the second switch SW2 is OFF. At this time, the amplifier circuit 61 is equivalent to the phase 1 state of the amplifier circuit 60 illustrated in FIG. 3.

In the phase 2 state, only the second switch SW2 is ON; and the first switch SW1, the third switch SW3, and the fourth switch SW4 are OFF. At this time, the amplifier circuit 61 is equivalent to the phase 2 state of the amplifier circuit 60 illustrated in FIG. 4.

Accordingly, according to the amplifier circuit 61 of this embodiment, the offset voltages of the first amplifier 10 and the second amplifier 20 are canceled similarly to those of the amplifier circuit 60, and a high-precision amplifier circuit can be provided in which the gain may be set in a wide range from low gains to high gains. In particular, in the case where an operational amplifier having a CMOS input with a high input offset voltage but a high input impedance is used, a high-precision amplifier circuit is possible having high input impedance and low offset.

Each of the switches SW1 to SW4 may be formed of a FET and the like.

The control of the states of each of the switches SW1 to SW4 may be performed externally. However, the control also may be performed by providing an internal control circuit and periodically switching the states.

Figure 9:
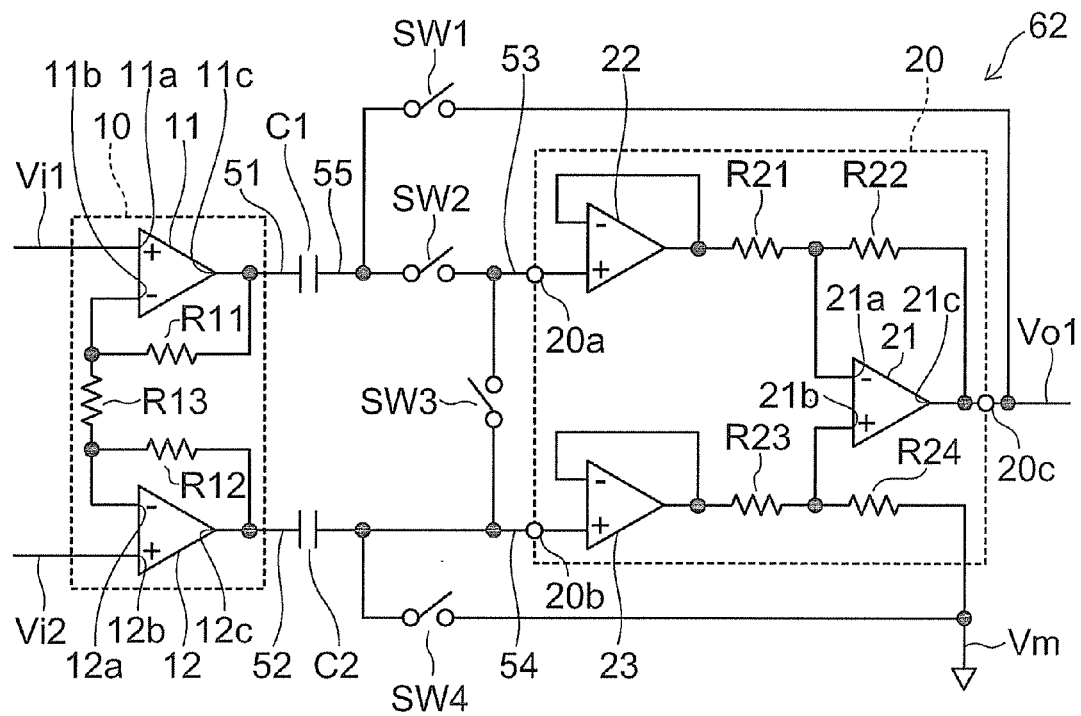
FIG. 9 is a block diagram illustrating another configuration of the amplifier circuit according to the embodiment of the invention.

FIG. 9 is a block diagram illustrating another configuration of the amplifier circuit according to an embodiment of the invention.

FIG. 9 illustrates the case where the first amplifier 10 of the amplifier circuit 61 illustrated in FIG. 6 is formed of the first and second operational amplifiers 11 and 12; and the second amplifier 20 is formed of a third operational amplifier 21 and buffers 22 and 23. The first switch SW1 to the fourth switch SW4, the first capacitor C1, and the second capacitor C2 are similar to those of the amplifier circuit 61 illustrated in FIG. 6. The buffers 22 and 23 may be omitted.

The first amplifier 10 and the second amplifier 20 have configurations similar to the initial-stage amplifier and the post-stage amplifier of an instrumentation amplifier, respectively. However, the second amplifier 20 includes the buffers 22 and 23; and the buffers 22 and 23 receive the third signal 53 input into the first input terminal 20a (the inverted input) and the fourth signal 54 input into the second input terminal 20b (the non-inverted input), respectively.

In other words, the first amplifier 10 has a configuration in which a resistor R13 connects an inverting input terminal 11b of the first operational amplifier 11 including a feedback resistor R11 to an inverting input terminal 12a of a second operational amplifier 12 including a feedback resistor R12. The first input signal Vi1 is input into a non-inverting input terminal 11a of the first operational amplifier 11. The second input signal Vi2 is input into a non-inverting input terminal 12b of the second operational amplifier 12. The first operational amplifier 11 outputs the first signal 51 from an output terminal 11c. The second operational amplifier 12 outputs the second signal 52 from an output terminal 12c.

The second amplifier 20 includes the buffers 22 and 23 and the third operational amplifier 21 including a feedback resistor R22 (a fourth resistor). The third signal 53 is input into the first input terminal 20a and is input into an inverting input terminal 21a of the third operational amplifier 21 via the buffer 22 and an input resistor R21. The fourth signal 54 is input into the second input terminal 20b and is input into a non-inverting input terminal 21b of the third operational amplifier 21 via the buffer 23 and a fifth resistor R23. The non-inverting input terminal 21b of the third operational amplifier 21 is supplied with the reference potential Vm via a sixth resistor R24. An output terminal 21c of the third operational amplifier 21 acts as the output terminal 20c of the second amplifier 20 to output the first output signal Vo1.

The resistance of each of the resistors of the second amplifier 20 may be set as R21=R22=R23=R24. In other words, the third operational amplifier 21 and the second amplifier 20 are set to gains of unity.

Here, it is taken that $$A_1 = R11/R13 = R12/R13 \text{ and } A_2 = 1 + A_1. \tag{2-1}$$

The case is considered where a signal having the potential $V_2$ is input as the first input signal Vi1 and a signal having the potential $V_1$ is input as the second input signal Vi2 in the phase 1 state.

First, the signal components are considered ignoring the offset voltages.

The one terminal of the first capacitor C1, i.e., the potential $V_{51}$ of the first signal 51, is expressed by Formula (2-2).

$$V_{51} = V_2 \times A_2 - V_1 \times A_1 \tag{2-2}$$

Similarly, the one terminal of the second capacitor C2, i.e., the potential $V_{52}$ of the second signal 52, is expressed by Formula (2-3).

$$V_{52} = V_1 \times A_2 - V_2 \times A_1 \quad (2-3)$$

Accordingly, from Formulas (2-2), (2-3), and (1-3), the voltages $V_{SC1}$ and $V_{SC2}$ of the signal components charged into the first and second capacitors C1 and C2 are expressed by Formulas (2-4) and (2-5), respectively, with the first amplifier 10 side as a reference.

$$V_{SC1} = Vm - V_{51} = Vm + V_1 \times A_1 - V_2 \times A_2 \quad (2-4)$$

$$V_{SC2} = Vm - V_{52} = Vm - V_1 \times A_2 + V_2 \times A_1 \quad (2-5)$$

Next, the offset components are considered ignoring the signal components (where $V_1 = V_2 = 0$).

The input offset voltages of the first and second operational amplifiers 11 and 12 are taken to be $V_{offs1}$ and $V_{offs2}$, respectively. The input offset voltage of the second amplifier 20 is taken to be $V_{offs3}$. However, the input offset voltage $V_{offs3}$ of the second amplifier 20 in an amplifier circuit 62 illustrated in FIG. 9 is expressed as $V_{offs3} = -Vof22 + Vof23 + 2 \times Vof21$, where Vof21, Vof22, and Vof23 are the input conversion offset voltages of the third operational amplifier 21, the buffer 22, and the buffer 23, respectively.

The offset voltage Voc1 charged into the first capacitor C1 is expressed by Formula (2-6) with the first amplifier 10 side, i.e., the first signal 51 side, as a reference.

$$Voc1 = -V_{offs1} \times A_2 + V_{offs2} \times A_1 + V_{offs3} \quad (2-6)$$

The offset voltage Voc2 charged into the second capacitor C2 is expressed by Formula (2-7) with the first amplifier 10 side, i.e., the second signal 52 side, as a reference.

$$Voc2 = V_{offs1} \times A_1 - V_{offs2} \times A_2 \quad (2-7)$$

Next, the case of the phase 2 state is considered.

Namely, a signal having the potential $V_1$ is input as the first input signal Vi1 and a signal having the potential $V_2$ is input as the second input signal Vi2 in the phase 2 state.

First, the signal components are considered ignoring the offset voltages.

The one terminal of the first capacitor C1, i.e., the potential $V_{51}$ of the first signal 51, is expressed by Formula (2-8).

$$V_{51} = V_1 \times A_2 - V_2 \times A_1 \quad (2-8)$$

Similarly, the one terminal of the second capacitor C2, i.e., the potential $V_{52}$ of the second signal 52, is expressed by Formula (2-9).

$$V_{52} = V_2 \times A_2 - V_1 \times A_1 \quad (2-9)$$

Accordingly, from Formulas (2-4) and (2-8), the potential $V_{53}$ of the third signal 53 is expressed by Formula (2-10).

$$V_{53} = V_{51} + V_{SC1} \quad (2-10)$$
$$= Vm - (V_2 - V_1)(A_1 + A_2)$$

Similarly, from Formulas (2-5) and (2-9), the potential $V_{54}$ of the fourth signal 54 is expressed by Formula (2-11).

$$V_{54} = V_{52} + V_{SC2} \quad (2-11)$$
$$= Vm + (V_2 - V_1)(A_1 + A_2)$$

Accordingly, from Formulas (2-10) and (2-11), the first output signal Vo1 for the signal components is expressed by Formula (2-12).

$$Vo1 = V_{54} - V_{53} \quad (2-12)$$
$$= 2(V_2 - V_1)(A_1 + A_2)$$
$$= 2(V_2 - V_1)(1 + 2A_1)$$

Next, the offset components are considered.

From Formula (2-6), the offset voltage $V_{o53}$ of the third signal 53 is expressed by Formula (2-13).

$$V_{o53} = V_{offs1} \times A_2 - V_{offs2} \times A_1 + Voc1 \quad (2-13)$$
$$= V_{offs1} \times A_2 - V_{offs2} \times A_1 +$$
$$\quad (-V_{offs1} \times A_2 + V_{offs2} \times A_1 + V_{offs3})$$
$$= V_{offs3}$$

Similarly, from Formula (2-7), the offset voltage $V_{o54}$ of the fourth signal 54 is expressed by Formula (2-14).

$$V_{o54} = V_{offs2} \times A_2 - V_{offs1} \times A_1 + Voc2 \quad (2-14)$$
$$= V_{offs2} \times A_2 - V_{offs1} \times A_1 + (V_{offs1} \times A_1 - V_{offs2} \times A_2)$$
$$= 0$$

Accordingly, from Formulas (2-13) and (2-14), the input offset voltage Vo1 of the second amplifier 20 is expressed by (2-15).

$$Vo2 = V_{o54} - V_{o53} + V_{offs3} \quad (2-15)$$
$$= 0$$

Thus, the input offset voltage Vo2 of the second amplifier 20 is zero. Therefore, the offset voltage of the first output signal Vo1 of the second amplifier 20 is zero.

Thus, for the first output signal Vo1 of the second amplifier 20, the offset voltage components are canceled to become zero, and only the output signal with respect to the signal component Vo1=2($V_2$−$V_1$)($A_1$+$A_2$) remains.

Accordingly, in the amplifier circuit 62 of this embodiment as well, the first and second input signals Vi1 and Vi2 may be taken to be the inverted signals of the signals measured in the phase 1 state; and the output of the amplified signal components having canceled offset voltage components in the phase 2 state may be taken to be the signal measured in the phase 2 state.

By using the amplifier circuit 62 of this embodiment, the effects of the offsets of the first and second amplifiers 10 and 20 can be reduced, and a high-precision amplifier circuit is possible in which the gain may be set in a wide range from low gains to high gains. In particular, in the case where an operational amplifier having a CMOS input with a high input offset voltage but a high input impedance is used, a high-precision amplifier circuit is possible having high input impedance and low offset.

Similarly to the amplifier circuits 60 and 61, in the case where the phase 1 state and the phase 2 state are periodically repeated, it is sufficient to sample the first output signal Vo1 when the phase 2 state ends, that is, when switching from the phase 2 state to the phase 1 state.

Figure 10:
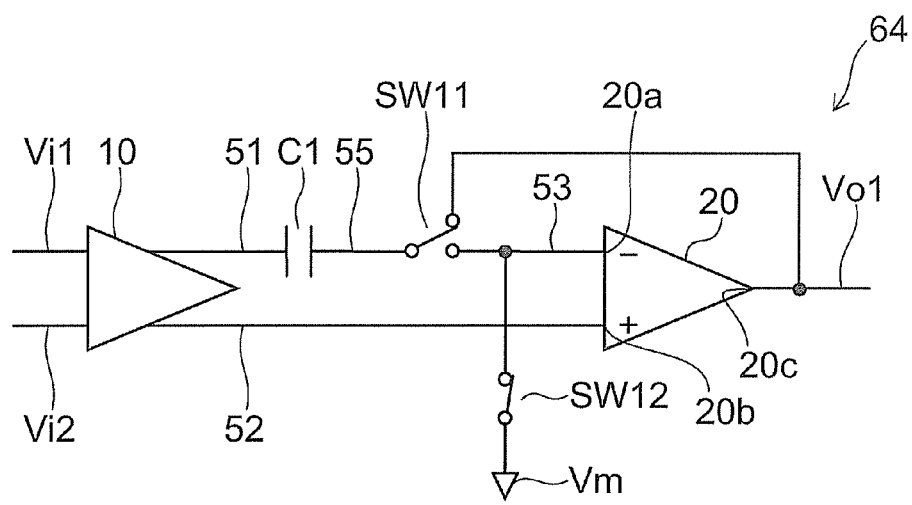
FIG. 10 is a block diagram illustrating the configuration of an amplifier circuit according to another embodiment of the invention.

FIG. 10 is a block diagram illustrating the configuration of an amplifier circuit according to another embodiment of the invention.

As illustrated in FIG. 10, an amplifier circuit 64 of this embodiment includes the first amplifier 10, the second amplifier 20, the first capacitor C1, a fifth switch SW11, and a sixth switch SW12.

The first amplifier 10 is similar to that of the amplifier circuit 60 illustrated in FIG. 1 and amplifies the first input signal Vi1 and the second input signal Vi2 to output the first signal 51 and the second signal 52, respectively.

The second amplifier 20 amplifies the difference between the third signal 53 input into the first input terminal 20a (the inverted input) and the second signal 52 input into the second input terminal 20b (the non-inverted input) to output the first output signal Vo1 from the output terminal 20c. The second amplifier 20 performs the differential amplification with respect to the reference potential Vm. The first input terminal 20a of the second amplifier 20 is connected to the sixth switch SW12. In the phase 1 state (the first state), the sixth switch SW12 is ON and the first input terminal 20a is supplied with the reference potential Vm. In the phase 2 state (the second state), the sixth switch SW12 is OFF.

The one terminal of the first capacitor C1 is connected to the first amplifier 10 to receive input of the first signal 51. The other terminal 55 of the first capacitor C1 is connected to the fifth switch SW11. In the phase 1 state (the first state), the other terminal 55 of the first capacitor C1 is connected to the output terminal 20c of the second amplifier 20 by the fifth switch SW11, where the second amplifier 20 is set to a gain of unity; and as recited above, the first input terminal 20a of the second amplifier 20 is supplied with the reference potential Vm by the sixth switch SW12.

As recited above, the first input terminal 20a of the second amplifier 20 is supplied with the reference potential Vm by the sixth switch SW12. Therefore, in the phase 1 state (the first state), the second amplifier 20, which is set to a gain of unity, amplifies the difference between the reference potential Vm and the second signal 52 output by the first amplifier 10 to output the potential of the other terminal 55 of the first capacitor C1 as the potential of the first output signal Vo1; and the first capacitor C1 is charged.

In the phase 2 state (the second state), the other terminal 55 of the first capacitor C1 is connected to the first input terminal 20a of the second amplifier 20 by the fifth switch SW11.

As recited above, the sixth switch SW12 is OFF. Therefore, in the phase 2 state (the second state), the second amplifier 20 amplifies the difference between the signal 55 of the other terminal of the first capacitor C1 and the second signal 52 output by the first amplifier 10 to output the first output signal Vo1.

In the phase 2 state (the second state), the second amplifier 20 may be set to any gain.

First, the phase 1 state is considered. In the phase 1 state, the fifth switch SW11 connects the other terminal 55 of the first capacitor C1 to the output terminal 20c of the second amplifier 20; and the sixth switch SW12 is ON.

The signal components are considered ignoring the offset voltages. A signal having the potential $V_2$ is input as the first input signal Vi1 of the first amplifier 10. A signal having the potential $V_1$ is input as the second input signal Vi2.

The signal having the potential $V_2$ is amplified by the first amplifier 10. The one terminal of the first capacitor C1, i.e., the potential $V_{51}$ of the first signal 51, is expressed by Formula (3-1).

$$V_{51} = V_2 \times A_v \tag{3-1}$$

Here, $A_v$ is the gain of the first amplifier 10.

Similarly, the potential $V_{52}$ of the second signal 52 is expressed by Formula (3-2).

$$V_{52} = V_1 \times A_v \tag{3-2}$$

The potential $V_{55}$ of the other terminal of the first capacitor C1 is equal to the potential of the first output signal Vo1, i.e., the output of the second amplifier 20. Because the reference potential Vm is applied to the first input terminal 20a of the second amplifier 20, the potential $V_{55}$ is expressed by Formula (3-3) taking the gain of the second amplifier 20 to be unity.

$$\begin{aligned} V_{55} &= Vo1 \\ &= V_{52} + V_{offs3} \\ &= V_1 \times A_v + V_{offs3} \end{aligned} \tag{3-3}$$

Accordingly, from Formulas (3-1) to (3-3), the voltage $V_{SC1}$ of the signal component charged into the first capacitor C1 is expressed by Formula (3-4) with the first amplifier 10 side as a reference.

$$\begin{aligned} V_{SC1} &= V_{55} - V_{51} \\ &= (V_1 - V_2) \times A_v \end{aligned} \tag{3-4}$$

Next, the offset voltages are considered ignoring the signal components (where $V_1=V_2=0$). The input offset voltages on the first and second input signal sides of the first amplifier 10 are taken to be $V_{offs1}$ and $V_{offs2}$, respectively. Similarly, the input offset voltage of the second amplifier 20 is taken to be $V_{offs3}$. The gain of the second amplifier 20 is taken to be unity.

The offset voltage Voc1 charged into the first capacitor C1 is expressed by Formula (3-5) with the first amplifier 10 side, i.e., the first signal 51 side, as a reference.

$$Voc1 = (-V_{offs1} + V_{offs2}) \times A_v + V_{offs3} \tag{3-5}$$

Next, the phase 2 state is considered. In the phase 2 state, as recited above, the fifth switch SW11 connects the other terminal 55 of the first capacitor C1 to the first input terminal 20a of the second amplifier 20; and the sixth switch SW12 is OFF.

A signal having the potential $V_1$ is input as the first input signal Vi1. A signal having the potential $V_2$ is input as the second input signal Vi2.

First, the signal components are considered ignoring the offset voltages.

The signal having the potential $V_1$ is amplified by the first amplifier 10. The one terminal of the first capacitor C1, i.e., the potential $V_{51}$ of the first signal 51, is expressed by Formula (3-6).

$$V_{51} = V_1 \times A_v \tag{3-6}$$

Similarly, the potential $V_{52}$ of the second signal 52 is expressed by Formula (3-7).

$$V_{52} = V_2 \times A_v \quad (3\text{-}7)$$

Accordingly, from Formulas (3-4) and (3-6), the potential $V_{55}$ of the other terminal 55 of the first capacitor C1 is expressed by Formula (3-8).

$$\begin{aligned} V_{55} &= V_{51} + V_{SC1} \\ &= (2V_1 - V_2)A_v \end{aligned} \quad (3\text{-}8)$$

From Formulas (3-7) and (3-8), the first output signal Vo1, i.e., the output of the second amplifier 20, is expressed by Formula (3-9) for the signal components.

$$\begin{aligned} Vo1 &= V_{52} - V_{55} \\ &= 2(V_2 - V_1)A_v \end{aligned} \quad (3\text{-}9)$$

Next, the offset components are considered.

From Formula (3-5), the offset voltage $V_{o53}$ input into the second amplifier 20 from the other terminal 55 of the first capacitor C1 is expressed by Formula (3-10).

$$\begin{aligned} V_{o53} &= V_{offs1} \times A_v + Voc1 \\ &= V_{offs1} \times A_v + (-V_{offs1} + V_{offs2}) \times A_v + V_{offs3} \end{aligned} \quad (3\text{-}10)$$

Accordingly, from Formula (3-10), the input offset voltage Vo2 of the second amplifier 20 is expressed by Formula (3-11).

$$\begin{aligned} Vo2 &= V_{offs2} \times A_v - V_{o53} + V_{offs3} \\ &= 0 \end{aligned} \quad (3\text{-}11)$$

Thus, the input offset voltage Vo2 of the second amplifier 20 is zero. Therefore, the offset voltage of the first output signal Vo1 of the second amplifier 20 is zero.

Thus, for the first output signal Vo1 of the second amplifier 20, the offset voltage components are canceled and become zero, and only the output signal with respect to the signal component Vo1=2 $(V_2-V_1) A_v$ remains.

Accordingly, in the amplifier circuit 64 of this embodiment as well, the first and second input signals Vi1 and Vi2 may be taken to be the inverted signals of the signals measured in the phase 1 state; and the output of the amplified signal components having canceled offset voltage components in the phase 2 state may be taken to be the signal measured in the phase 2 state.

As recited above, the gain of the second amplifier 20 in the phase 1 state is unity. However, it is unnecessary for the gain of the second amplifier 20 to be unity in the phase 2 state; and the offset voltage components similarly cancel for values other than one. In other words, as illustrated in Formula (3-11), the input offset voltage of the second amplifier 20 cancels. Therefore, in the phase 2 state, the gain of the second amplifier 20 may be set to any value, and there is no limitation on the gain of the second amplifier 20.

Compared to those of the amplifier circuit 60 illustrated in FIG. 1, the numbers of capacitors and switches can be reduced in the amplifier circuit 64 of this embodiment. However, because the configuration is asymmetrical, as in Formula (3-8), the other terminal of the first capacitor C1, i.e., the potential of the signal 55, is larger than that of Formula (1-10) of the amplifier circuit 60; and the dynamic range is limited.

Conversely, according to an amplifier circuit 62 illustrated in FIG. 9, the inputs to the second amplifier 20 are balanced positive and negative. As in Formulas (2-10) and (2-15), the offset voltages can be canceled, the dynamic range can be wide, and a high overall gain is possible.

By using the amplifier circuit 64 of this embodiment, the effects of the offsets of the first and second amplifiers 10, 20 can be reduced; and a high-precision amplifier circuit is possible in which the gain may be set in a wide range from low gains to high gains.

Similarly to the amplifier circuits 60 to 62, in the case where the phase 1 state and the phase 2 state are periodically repeated, it is sufficient to sample the first output signal Vo1 when the phase 2 state ends, that is, when switching from the phase 2 state to the phase 1 state.

In the amplifier circuit 64 of this embodiment as well, the first amplifier 10 and the second amplifier 20 may be configured as those of the amplifier circuit 62 illustrated in FIG. 9.

Namely, the first amplifier 10 may have a configuration in which the resistor R13 connects the inverting input terminal 11b of the first operational amplifier 11 including the feedback resistor R11 to the inverting input terminal 12a of the second operational amplifier 12 including the feedback resistor R12.

The first input signal Vi1 is input to the non-inverted input terminal 11a of the first operational amplifier 11. The second input signal Vi2 is input as the non-inverting input terminal 12b of the second operational amplifier 12. The first signal 51 is output from the output terminal 11c of the first operational amplifier 11. The second signal 52 is output from the output terminal 12c of the second operational amplifier 12.

In the second amplifier 20, the third signal 53 is input into the first input terminal 20a and input into the inverting input terminal 21a of the third operational amplifier 21 via the buffer 22 and the resistor R21. The second signal 52 is input into the second input terminal 20b and input into the resistors R23 and R24 connected in series via the buffer 23. The output terminal 21c of the third operational amplifier 21 is configured as the output terminal 20c of the second amplifier 20 to output the first output signal Vo1.

Here, as recited above, each of the resistors of the second amplifier 20 are set such that R21=R22=R23=R24. In other words, the third operational amplifier 21 is set to a gain of unity.

At this time, the offset voltages of the first and second amplifiers 10 and 20 are canceled similarly to Formulas (2-1) to (3-11) recited above.

Thus, in the amplifier circuit 64 illustrated in FIG. 10 as well, the first and second amplifiers 10 and 20 may be formed of the first to third operational amplifiers 11 to 21. In particular, by using an operational amplifier having a CMOS input with a high input offset voltage but a high input impedance, a high-precision amplifier circuit is possible having high input impedance and low offset.

Figures 11, 12:
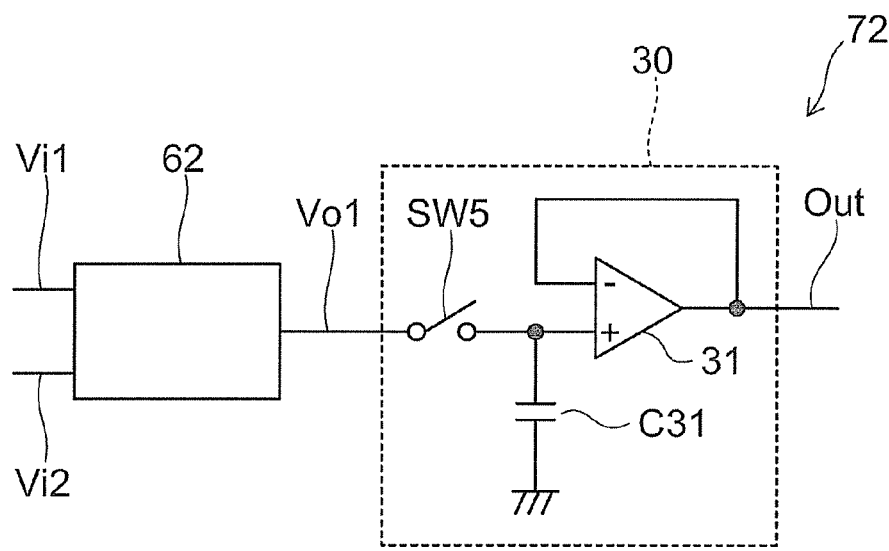
FIG. 11 is a block diagram illustrating the configuration of an amplifier circuit according to another embodiment of the invention.
FIG. 12 is a schematic view illustrating the connection states of each of the switches of the amplifier circuit showed in FIG. 11.

FIG. 11 is a block diagram illustrating the configuration of an amplifier circuit according to another embodiment of the invention.

FIG. 11 illustrates the configuration of an amplifier circuit 72 including the amplifier circuit 62 and a sample and hold circuit 30.

As illustrated in FIG. 11, the sample and hold circuit 30 includes a buffer 31, a hold capacitor C31, and a switch SW5.

The amplifier circuit 62 is similar to the amplifier circuit illustrated in FIG. 9.

The switch SW5 is OFF when the amplifier circuit 62 is in the phase 1 and phase 2 states. In a following phase 2' state, the switch SW5 is switched ON; and the first output signal Vo1 of the amplifier circuit 62 is sampled into the capacitor C31 (FIG. 12).

The voltage of the capacitor C31 is output as a second output signal Out via the buffer 31. In the following phase 1 state and phase 2 state, the switch SW5 is switched OFF; the voltage of the capacitor C31 is held at the voltage when switching from the phase 2' state to the phase 1 state; and the second output signal Out is output.

The state of the sample and hold circuit 30 is a sample mode in the phase 2' state and a hold mode in the phase 1 state and the phase 2 state.

The amplifier circuit 62 is the same in the phase 2' state and the phase 2 state; and it is unnecessary to discriminate between the phase 2' state and the phase 2 state in the amplifier circuit 62. In other words, for the amplifier circuit 62, the phase 2' state is included in the phase 2 state.

The first switch SW1 to the fourth switch SW4 have connection states similar to those illustrated in FIG. 7 (the phase 2' state is the same as the phase 2 state).

Although a configuration is illustrated in the amplifier circuit 72 of this embodiment in which the amplifier circuit 62 is used, the invention is not limited thereto. For example, the amplifier circuits 60, 61, and 64 also may be used.

Here, the connection states and the main signals of each of the switches of the amplifier circuit 72 are as illustrated in FIGS. 13A to 13H.

FIGS. 13A to 13H illustrate the first switch SW1 to the fourth switch SW4 and the switch SW5 (FIGS. 13A to 13E), the first input signal Vi1 (FIG. 13F), the second input signal Vi2 (FIG. 13G), and the second output signal Out (FIG. 13H) for each of the phases.

Figure 13:
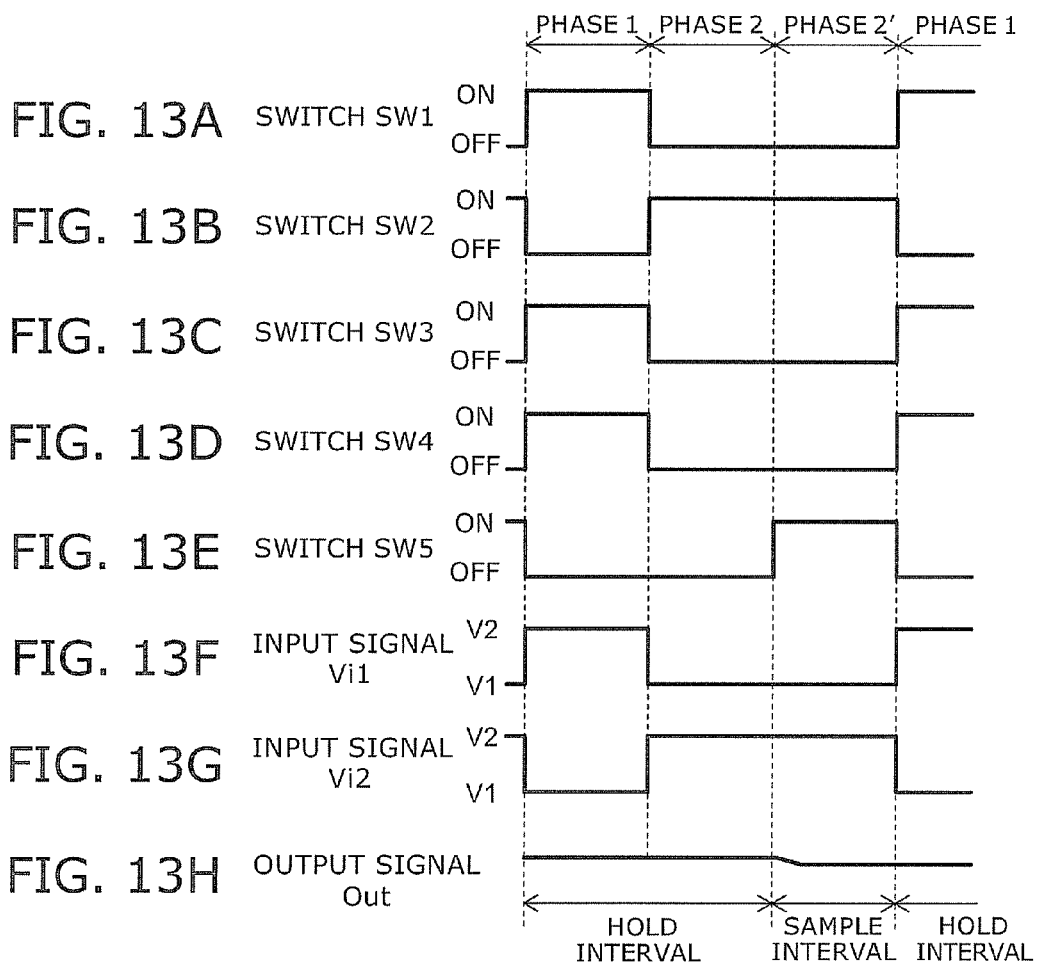
FIGS. 13A to 13H are timing charts illustrating the connection states and the main signals of each of the switches of the amplifier circuit showed in FIG. 11.

In the phase 1 state as illustrated in FIGS. 13F to 13G, a signal having the potential $V_2$ is input as the first input signal Vi1; and a signal having the potential $V_1$ is input as the second input signal Vi2. In the phase 2 state and the phase 2' state, a signal having the potential $V_1$ is input as the first input signal Vi1 and a signal having the potential $V_2$ is input as the second input signal Vi2.

In the phase 1 state and the phase 2 state as illustrated in FIG. 13H, the voltage sampled in the previous period is held and output as the second output signal Out. In the phase 2' state, the first output signal Vo1 of the phase 2 state is sampled, and the voltage thereof is output as the second output signal Out.

By periodically repeating the phase 1 state, the phase 2 state, and the phase 2' state, the potential difference between the first and second input signals Vi1 and Vi2 is amplified; and the sampled and held voltage is output as the second output signal Out. As recited above, the phase 2' state is a sample mode in which the switch SW5 of the sample and hold circuit 30 is switched ON. For the other switches (the first to fourth switches SW1 to SW4) and the first switch circuit 41, the phase 2' state is included in the phase 2 state.

Thus, by including the sample and hold circuit 30, it is possible to amplify a weak voltage Vi1–Vi2 to output a stable signal.

FIG. 14 is a block diagram illustrating the configuration of an amplifier circuit according to another embodiment of the invention.

As illustrated in FIG. 14, an amplifier circuit 82 of this embodiment includes the amplifier circuit 72 and a second switch circuit 42 and has a one-chip structure in which, for example, the amplifier circuit 72 and the second switch circuit 42 are formed on the same semiconductor substrate.

The second switch circuit 42 receives input of a third input signal In1 and a fourth input signal In2 and outputs the first input signal Vi1 and the second input signal Vi2.

Here, the second switch circuit 42 has the phase 1 state and the phase 2 state and switches synchronously with the phase 1 state and the phase 2 state of the amplifier circuit 72.

FIGS. 15A to 15G illustrate the connection states and the main signals of each of the switches of the amplifier circuit 82 illustrated in FIG. 14. The first switch SW1 to the fourth switch SW4 and the switch SW5 (FIGS. 15A to 15E) are similar to the first switch SW1 to the fourth switch SW4 and the switch SW5 illustrated in FIGS. 13A to 13E, respectively.

In the phase 1 state as illustrated in FIGS. 15F to 15G, the second switch circuit 42 receives input of the third input signal In1 and outputs the third input signal In1 as the second input signal Vi2 to the amplifier circuit 72; and the second switch circuit 42 receives input of the fourth input signal In2 and outputs the fourth input signal In2 as the first input signal Vi1 to the amplifier circuit 72. In the phase 2 state and the phase 2' state, the second switch circuit 42 receives input of the third input signal In1 and outputs the third input signal In1 as the first input signal Vi1 to the amplifier circuit 72; and the second switch circuit 42 receives input of the fourth input signal In2 and outputs the fourth input signal In2 as the second input signal Vi2 to the amplifier circuit 72.

As recited above, the phase 2' state is a sample mode in which the switch SW5 of the sample and hold circuit 30 is switched ON. For the other switches (the first to fourth switches SW1 to SW4) or the first and second switch circuits 41 and 42, the phase 2' state is included in the phase 2 state.

Thus, by including the second switch circuit 42 in the amplifier circuit 82 of this embodiment, the signals to be measured having the potentials $V_1$ and $V_2$ can be input as-is as the third input signal In1 and the fourth input signal In2, respectively. In other words, it is unnecessary to switch the signals having the potentials $V_1$ and $V_2$ synchronously with the phases of the amplifier circuit 82.

The control of the states of the second switch circuit 42 may be performed externally similarly to the first switch circuit 41. However, the control also may be performed by providing an internal control circuit and periodically switching the states.

Although a configuration is illustrated in the amplifier circuit 82 of this embodiment in which the amplifier circuit 72 is used, the invention is not limited thereto. For example, the amplifier circuits 60 to 64 also may be used.

Figure 16:
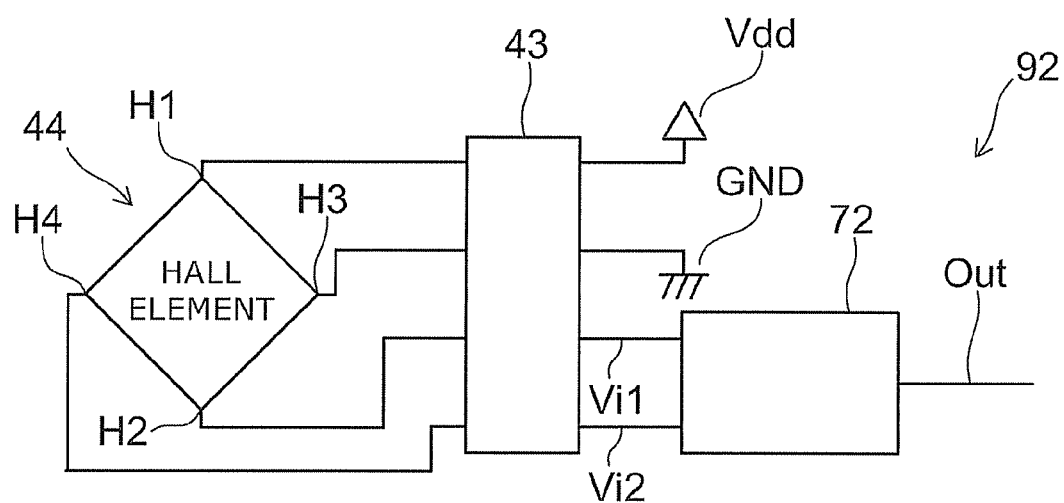
FIG. 16 is a block diagram illustrating the configuration of a magnetic sensor according to another embodiment of the invention.
Figure 17:
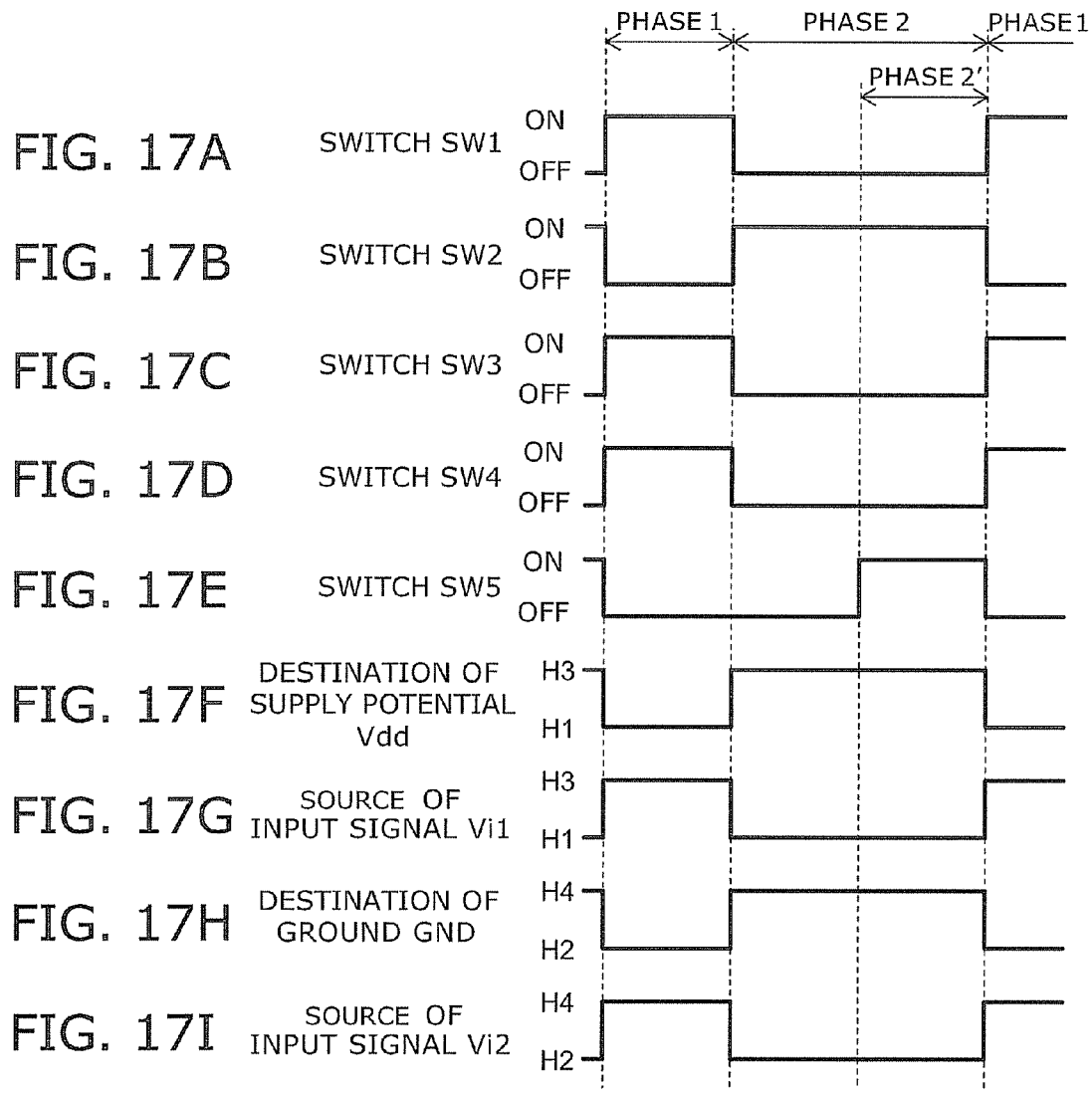
FIGS. 17A to 17I are timing charts illustrating the third switch circuit and the connection states of each of the switches of the magnetic sensor showed in FIG. 16.

FIG. 16 is a block diagram illustrating the configuration of a magnetic sensor according to another embodiment of the invention.

As illustrated in FIG. 16, a magnetic sensor 92 of this embodiment includes a Hall element 44, a third switch circuit 43, and the amplifier circuit 72 and has, for example, a one-chip structure in which the Hall element 44, the third switch circuit 43, and the amplifier circuit 72 are formed on the same semiconductor substrate.

The Hall element 44 includes a first terminal pair (H1 and H2) and a second terminal pair (H3 and H4) positioned on mutually orthogonal lines.

The third switch circuit 43 supplies a supply potential Vdd and a ground potential to the first terminal pair (H1 and H2) or the second terminal pair (H3 and H4) and outputs the outputs of the second terminal pair (H3 and H4) or the first terminal pair (H1 and H2) as the first input signal Vi1 and the second input signal Vi2 to amplifier circuit 72.

Here, the third switch circuit 43 includes the phase 1 state and the phase 2 state and switches synchronously with the phase 1 state and the phase 2 state of the amplifier circuit 72.

Here, FIGS. 17A to 17I illustrate the connection states of the third switch circuit 43 and each of the switches of the magnetic sensor 92. The first switch SW1 to the fourth switch SW4 and the switch SW5 (FIGS. 17A to 17E) are similar to the first switch SW1 to the fourth switch SW4 and the switch SW5 illustrated in FIGS. 8A to 8E, respectively.

In the phase 1 state as illustrated in FIGS. 17A to 17I, the third switch circuit 43 supplies the supply potential Vdd and the ground potential to the first terminal pair (H1 and H2) of the Hall element 44 and outputs the outputs of the second terminal pair (H3 and H4) of the Hall element 44 as the first and second input signals Vi1 and Vi2 to the amplifier circuit 72.

In the phase 2 state and the phase 2' state, the third switch circuit 43 supplies the supply potential Vdd and the ground potential to the second terminal pair (H3 and H4) of the Hall element 44, and outputs the outputs of the first terminal pair (H1 and H2) of the Hall element 44 as the first and second input signals Vi1 and Vi2 to the amplifier circuit 72.

As recited above, the phase 2' state is a sample mode in which the switch SW5 of the sample and hold circuit 30 is switched ON. For the other switches (the first to fourth switches SW1 to SW4) or the first to third switch circuits 41 to 43, the phase 2' state is included in the phase 2 state.

Figure 18:
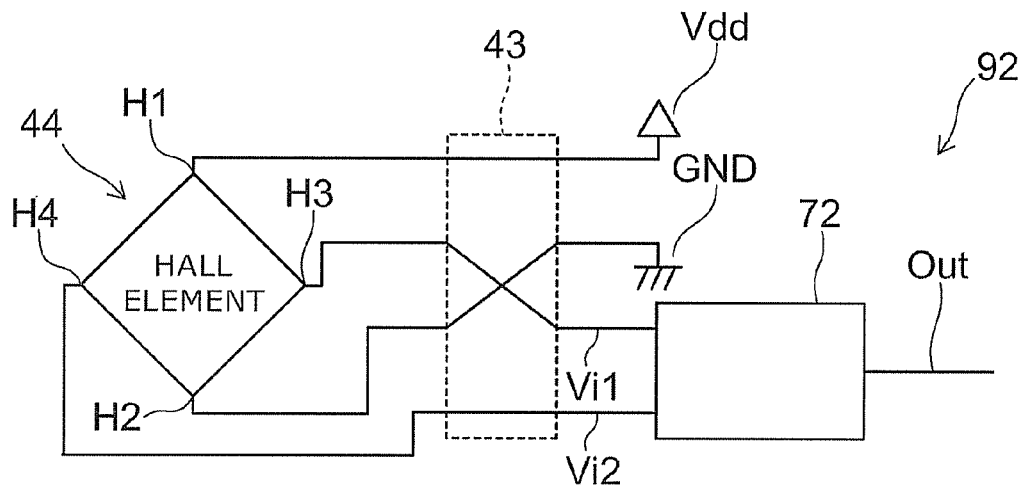
FIG. 18 is a block diagram of the third switch circuit of the magnetic sensor showed in FIG. 16 in a phase 1 state.

In the phase 1 state, the third switch circuit 43 of the magnetic sensor 92 has the configuration illustrated in the block diagram of FIG. 18.

FIG. 18 illustrates the third switch circuit 43 enclosed by the broken line and the phase 1 state (the electrical connections) of the third switch circuit 43 by solid lines.

In the phase 1 state as illustrated in FIG. 18, the third switch circuit 43 supplies the supply potential Vdd to the terminal H1 of the first terminal pair (H1 and H2) of the Hall element 44, and supplies the ground potential to the terminal H2. The output of the terminal H3 of the second terminal pair (H3 and H4) of the Hall element 44 is output as the first input signal Vi1 to the amplifier circuit 72 and the output of the terminal H4 of the second terminal pair (H3 and H4) of the Hall element 44 is output as the second input signal Vi2 to the amplifier circuit 72.

In other words, in the phase 1 state, the third switch circuit 43 provides a drive current from the power supply to the first terminal pair (H1 and H2) of the Hall element 44, and outputs the output voltages of the second terminal pair (H3 and H4) as the first and second input signals Vi1 and Vi2 to the amplifier circuit 72.

Figure 19:
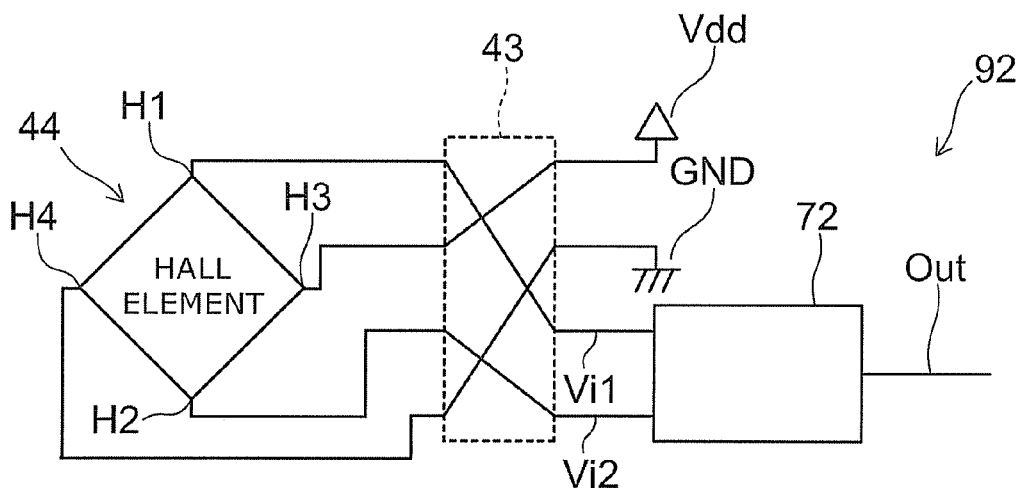
FIG. 19 is a block diagram of the third switch circuit of the magnetic sensor showed in FIG. 16 in a phase 2 state.

In the phase 2 state, the third switch circuit 43 of the magnetic sensor 92 has the configuration illustrated in the block diagram of FIG. 19.

In FIG. 19 as well, the third switch circuit 43 is enclosed by the broken line, and the phase 2 state (the electrical connections) of the third switch circuit 43 is illustrated by solid lines.

In the phase 2 state as illustrated in FIG. 19, the third switch circuit 43 supplies the supply potential Vdd to the terminal H3 of the second terminal pair (H3 and H4) of the Hall element 44 and supplies the ground potential to the terminal H4. The output of the terminal H1 of the first terminal pair (H1 and H2) of the Hall element 44 is output as the first input signal Vi1 to the amplifier circuit 72, and the output of the terminal H2 of the first terminal pair (H1 and H2) of the Hall element 44 is output as the second input signal Vi2 to the amplifier circuit 72.

In other words, in the phase 2 state, the third switch circuit 43 provides a drive current from the power supply to the second terminal pair (H3 and H4) of the Hall element 44, and outputs the output voltages of the first terminal pair (H1 and H2) as the first and second input signals Vi1 and Vi2 to the amplifier circuit 72.

Thus, the drive current in the Hall element 44 is controlled to flow in the vertical direction in the phase 1 state and in the horizontal direction in the phase 2 state. The output voltage of the Hall element 44 is inverted and its inverted output voltage is output as the first and second input signals Vi1 and Vi2 to the amplifier circuit 72 in the phase 1 state and the phase 2 state.

However, the Hall element 44 has a property that the Hall electromotive force does not change and the polarity of the offset voltages inverts when the drive terminals and the output terminals are switched and the drive current direction is rotated 90 degrees.

The magnetic sensor 92 of this embodiment provides inputs by rotating 90 degrees the drive current direction of the Hall element 44 between the phase 1 state and the phase 2 state and by inverting the output voltage of the Hall element 44.

Therefore, the second output signal Out, i.e., the output of the magnetic sensor 92, is the sum of the input voltage of the phase 1 state and the input voltage of the phase 2 state. In other words, the signal of twice the Hall electromotive force amplified by the amplifier circuit 72 is output as the second output signal Out. On the other hand, the offset voltage of the Hall element 44 is reduced by cancellation.

Thus, the magnetic sensor 92 of this embodiment can reduce the offsets of the amplifier circuit 72 and the Hall element 44 and amplify only the Hall electromotive force to provide a high-precision magnetic sensor in which the gain may be set in a wide range from low gains to high gains.

The third switch circuit 43 of this embodiment also may have a configuration using switches as in the amplifier circuit 61 illustrated in FIG. 6.

The control of the states of the third switch circuit 43 may be performed externally similarly to the first and second switch circuits 41 and 42. However, the control also may be performed by providing an internal control circuit and periodically switching the states.

Although a configuration is illustrated in this embodiment in which the amplifier circuit 72 is used, the invention is not limited thereto. The amplifier circuits 60 to 64 also may be used.

Hereinabove, exemplary embodiments of the invention are described with reference to specific examples. However, the invention is not limited to these specific examples. For example, one skilled in the art may appropriately select specific configurations of components of amplifier circuits and magnetic sensors from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all amplifier circuits and magnetic sensors practicable by an appropriate design modification by one skilled in the art based on the amplifier circuits and the magnetic sensors described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. An amplifier circuit, comprising:
a first amplifier amplifying a first and a second input signal, and outputting a first and a second signal;
a second amplifier amplifying a difference between a third signal of a first input terminal and a fourth signal of a second input terminal, and outputting a first output signal from an output terminal;
a first capacitor, having one terminal connected to the first amplifier, receiving the first signal;
a second capacitor, having one terminal connected to the first amplifier, and another terminal connected to the second input terminal, receiving the second signal and outputting the fourth signal; and
a first switch circuit, switching a connection of the output terminal, another terminal of the first capacitor, the first input terminal, and the second input terminal, and switching to supply the second input terminal and the another terminal of the first capacitor with a reference potential,
the first switch circuit configured to be
a first state, wherein
the first switch circuit connects the first input terminal to the second input terminal, and the output terminal to the another terminal of the first capacitor to supply a potential of the another terminal of the first capacitor with a potential of the first output signal output by the second amplifier set to a gain of unity, supplies the second input terminal and the another terminal of the second capacitor with the reference potential, and the first capacitor and the second capacitor are charged, and
a second state, wherein
the first switch circuit connects the first input terminal to the another terminal of the first capacitor, provides the output terminal and the second input terminal in an open state, and the second amplifier amplifies a difference between a signal of the another terminal of the first capacitor and a signal of the another terminal of the second capacitor to output the first output signal.

2. The circuit according to claim 1, wherein
the first switch circuit comprises:
a first switch, connected between the another terminal of the first capacitor and the output terminal, turning ON in the first state and OFF in the second state;
a second switch, connected between the another terminal of the first capacitor and the first input terminal, turning OFF in the first state and ON in the second state;
a third switch, connected between the first input terminal and the second input terminal, turning ON in the first state and OFF in the second state; and
a fourth switch turning ON in the first state to supply the another terminal of the second capacitor with the reference potential, and turning OFF in the second state.

3. The circuit according to claim 1, further comprising
a second switch circuit receiving a third and a fourth input signal and outputting the first and the second input signal,
the second switch circuit configured to
output the third input signal as the second input signal and output the fourth input signal as the first input signal in the first state and
output the third input signal as the first input signal and output the fourth input signal as the second input signal in the second state.

4. The circuit according to claim 1, further comprising a sample and hold circuit, sampling an output of the second amplifier circuit when changing from the second state to the first state, and holding during the first and second states.

5. The circuit according to claim 4, further comprising
a second switch circuit receiving a third and a fourth input signal and outputting the first and the second input signal,
the second switch circuit configured to
output the third input signal as the second input signal and output the fourth input signal as the first input signal in the first state and
output the third input signal as the first input signal and output the fourth input signal as the second input signal in the second state.

6. The circuit according to claim 1, wherein
the first amplifier comprises:
a first operational amplifier having a first resistor as a feedback resistor, receiving the first input signal into a non-inverting input terminal and outputting the first signal;
a second operational amplifier having a second resistor as a feedback resistor, receiving the second input signal into a non-inverting input terminal and outputting the second signal; and
a third resistor connecting an inverting input terminal of the first operational amplifier to an inverting input terminal of the second operational amplifier,
the second amplifier comprises:
a third operational amplifier having a fourth resistor as a feedback resistor;
an input resistor providing a signal input into the first input terminal to an inverting input terminal of the third operational amplifier;
a fifth resistor providing a signal input into the second input terminal to a non-inverting input terminal of the third operational amplifier; and
a sixth resistor having one end connected to the non-inverting input terminal of the third operational amplifier and the other end supplied with the reference potential,
the third operational amplifier being set to a gain of unity.

7. The circuit according to claim 6, wherein
the first switch circuit comprises:
a first switch, connected between the another terminal of the first capacitor and the output terminal, turning ON in the first state and OFF in the second state;
a second switch, connected between the another terminal of the first capacitor and the first input terminal, turning OFF in the first state and ON in the second state;
a third switch, connected between the first input terminal and the second input terminal, turning ON in the first state and OFF in the second state; and
a fourth switch turning ON in the first state to supply the another terminal of the second capacitor with the reference potential, and turning OFF in the second state.

8. The circuit according to claim 6, further comprising
a second switch circuit receiving a third and a fourth input signal and outputting the first and the second input signal,
the second switch circuit configured to
output the third input signal as the second input signal and output the fourth input signal as the first input signal in the first state and output the third input signal as the first input signal and output the fourth input signal as the second input signal in the second state.

9. The circuit according to claim 6, further comprising a sample and hold circuit, sampling an output of the second amplifier circuit when changing from the second state to the first state, and holding during the first and second states.

10. The circuit according to claim 8, wherein
the first switch circuit comprises:
a first switch, connected between the another terminal of the first capacitor and the output terminal, turning ON in the first state and OFF in the second state;
a second switch, connected between the another terminal of the first capacitor and the first input terminal, turning OFF in the first state and ON in the second state;
a third switch, connected between the first input terminal and the second input terminal, turning ON in the first state and OFF in the second state; and
a fourth switch turning ON in the first state to supply the another terminal of the second capacitor with the reference potential, and turning OFF in the second state.

11. The circuit according to claim 10, further comprising a sample and hold circuit configured to sample an output of the second amplifier circuit when changing from the second state to the first state and hold during the first and second states.

12. An amplifier circuit, comprising:
a first amplifier amplifying a first and a second input signal, and outputting a first and a second signal;
a second amplifier amplifying a difference between a third signal of a first input terminal and a fourth signal of a second input terminal and outputting a first output signal from an output terminal;
a first capacitor, having one terminal connected to the first amplifier, receiving the first signal;
a fifth switch connecting another terminal of the first capacitor to the output terminal or the first input terminal of the second amplifier; and
a sixth switch switching to supply the first input terminal of the second amplifier with a reference potential,
the fifth switch and the sixth switch configured to be
a first state, wherein
the fifth switch connects the another terminal of the first capacitor to the output terminal of the second amplifier to supply a potential of the another terminal of the first capacitor with a potential of the first output signal of the second amplifier set to a gain of unity, and the sixth switch supplies the first input terminal of the second amplifier with the reference potential, the second amplifier amplifies a difference between the reference potential and the second signal output by the first amplifier, and the first capacitor is charged; and
a second state, wherein
the fifth switch connects the another terminal of the first capacitor to the first input terminal of the second amplifier, the sixth switch turns OFF not to supply the first input terminal of the second amplifier with the reference potential, and the second amplifier to amplify a difference between a signal of the another terminal of the first capacitor and the second signal output by the first amplifier to output the first output signal.

13. The circuit according to claim 12, further comprising a sample and hold circuit, sampling an output of the second amplifier circuit when changing from the second state to the first state, and holding during the first and second states.

14. The circuit according to claim 12, wherein
the first amplifier comprises:
a first operational amplifier having a first resistor as a feedback resistor, receiving the first input signal into a non-inverting input terminal and outputting the first signal;
a second operational amplifier having a second resistor as a feedback resistor, receiving the second input signal into a non-inverting input terminal and outputting the second signal; and
a third resistor connecting an inverting input terminal of the first operational amplifier to an inverting input terminal of the second operational amplifier,
the second amplifier comprises:
a third operational amplifier having a fourth resistor as a feedback resistor;
an input resistor providing a signal input into the first input terminal to an inverting input terminal of the third operational amplifier;
a fifth resistor providing a signal input into the second input terminal to a non-inverting input terminal of the third operational amplifier; and
a sixth resistor having one end connected to the non-inverting input terminal of the third operational amplifier and the other end supplied with the reference potential,
the third operational amplifier being set to a gain of unity.

15. The circuit according to claim 14, further comprising a sample and hold circuit, sampling an output of the second amplifier circuit when changing from the second state to the first state, and holding during the first and second states.

16. The circuit according to claim 12, further comprising
a second switch circuit receiving a third and a fourth input signal and outputting the first and the second input signal,
the second switch circuit configured to
output the third input signal as the second input signal and output the fourth input signal as the first input signal in the first state and
output the third input signal as the first input signal and output the fourth input signal as the second input signal in the second state.

17. A magnetic sensor, comprising:
an amplifier circuit, the circuit including: a first amplifier amplifying a first and a second input signal, and outputting a first and a second signal; a second amplifier amplifying a difference between a third signal input into a first input terminal and a fourth signal input into a second input terminal and outputting a first output signal from an output terminal; a first capacitor, having one terminal connected to the first amplifier, receiving the first signal; a second capacitor, having one terminal connected to the first amplifier, and another terminal connected to the second input terminal, receiving the second signal and outputting the fourth signal; and a first switch circuit, switching a connection of the output terminal, another terminal of the first capacitor, the first input terminal, and the second input terminal, and switching to supply the second input terminal and the another terminal of the first capacitor with a reference potential;
a Hall element comprising a first terminal pair and a second terminal pair positioned on mutually orthogonal lines; and
a third switch circuit supplying a supply potential and a ground potential to the first terminal pair or the second terminal pair and providing outputs of the second terminal pair or the first terminal pair as the first input signal and the second input signal, the first switch circuit configured to be a first state, wherein the first switch circuit connects the first input terminal to the second input terminal, and the output terminal to the another terminal of the first capacitor to supply a potential of the another terminal of the first capacitor with a potential of the first output signal output by the second amplifier set to a gain of unity, supplies the second input terminal and the another terminal of the second capacitor with the reference potential, and the first capacitor and the second capacitor are charged, and a second state, wherein the first switch circuit connects the first input terminal to the another terminal of the first capacitor, provides the output terminal and the second input terminal in an open state, and the second amplifier amplifies a difference between a signal of the another terminal of the first capacitor and a signal of the another terminal of the second capacitor to output the first output signal, the third switch circuit configured to be the first state, wherein the third switch circuit supplies the supply potential and the ground potential to the first terminal pair and provides outputs of the second terminal pair as the first input signal and the second input signal, and the second state, wherein the third switch circuit supplies the supply potential and the ground potential to the second terminal pair and provides outputs of the first terminal pair as the first input signal and the second input signal.

18. The sensor according to claim 17, further comprising a sample and hold circuit, sampling an output of the second amplifier circuit when changing from the second state to the first state, and holding during the first and second states.

19. The sensor according to claim 17, wherein the first amplifier comprises:

a first operational amplifier having a first resistor as a feedback resistor, receiving the first input signal into a non-inverting input terminal, and outputting the first signal;

a second operational amplifier having a second resistor as a feedback resistor, receiving input of the second input signal into a non-inverting input terminal, and outputting the second signal; and a third resistor connecting an inverting input terminal of the first operational amplifier to an inverting input terminal of the second operational amplifier, the second amplifier comprises:

a third operational amplifier having a fourth resistor as a feedback resistor;

an input resistor providing a signal input into the first input terminal to an inverting input terminal of the third operational amplifier;

a fifth resistor providing a signal input into the second input terminal to a non-inverting input terminal of the third operational amplifier; and a sixth resistor having one end connected to the non-inverting input terminal of the third operational amplifier and the other end supplied with the reference potential, the third operational amplifier being set to a gain of unity.

20. The sensor according to claim 19, further comprising a sample and hold circuit, sampling an output of the second amplifier circuit when changing from the second state to the first state, and holding during the first and second states.

* * * * *